(12) United States Patent
Tsuzuki et al.

(10) Patent No.: US 6,316,832 B1
(45) Date of Patent: *Nov. 13, 2001

(54) MOLDLESS SEMICONDUCTOR DEVICE AND PHOTOVOLTAIC DEVICE MODULE MAKING USE OF THE SAME

(75) Inventors: Koji Tsuzuki, Ikoma; Tsutomu Murakami; Satoru Yamada, both of Nara; Yoshifumi Takeyama, Kyoto; Koichi Shimizu, Kyotanabe, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,287

(22) Filed: Nov. 13, 1998

(30) Foreign Application Priority Data

Nov. 17, 1997 (JP) .................................................... 9-315114

(51) Int. Cl.⁷ ............................ H01L 23/98; H01L 23/52; H01L 29/40

(52) U.S. Cl. .......................... 257/747; 257/787; 257/749; 257/734; 257/782; 257/784; 257/786; 257/433; 257/448; 257/459

(58) Field of Search ..................................... 257/433, 434, 257/435, 452, 443, 448, 457, 459, 739, 749, 747, 787, 782, 784, 786; 136/256, 251

(56) References Cited

U.S. PATENT DOCUMENTS

| | | | |
|---|---|---|---|
| 4,577,051 | * 3/1986 | Hartman | 136/244 |
| 5,261,969 | * 11/1993 | Stanbery | 136/249 |
| 5,310,965 | * 5/1994 | Senba et al. | 174/250 |
| 5,330,583 | * 7/1994 | Asai et al. | 136/251 |
| 5,391,235 | * 2/1995 | Inoue | 136/244 |
| 5,660,646 | 8/1997 | Kataoka et al. | 136/251 |
| 5,667,596 | 9/1997 | Tsuzuki et al. | 136/256 |
| 5,800,631 | 9/1998 | Yamada et al. | 136/251 |

FOREIGN PATENT DOCUMENTS

| | | |
|---|---|---|
| 0 535 614 | 4/1993 | (EP) . |
| 0535614 | 4/1993 | (EP) . |
| 0 789 392 | 8/1997 | (EP) . |
| 0789392 | 8/1997 | (EP) . |
| 57036852 | * 2/1982 | (JP) . |
| 291602 | 11/1993 | (JP) . |
| 082865 | 3/1997 | (JP) . |

OTHER PUBLICATIONS

Patent Abstracts of Japan, vol. 6, No. 107 (E–113), 6/82 (corresponds to JP 57–636852).

Patent Abstracts of Japan, vol. 13, No. 476 (E–837), 10–89 (corresponds to JP 1–187958).

Patent Abstracts of Japan, vol. 6, No. 107 (E–113), 6/82 for JP 57–036852.

Patent Abstracts of Japan, vol. 13, No. 476 (E–837), 10–89 JP 1–187958.

* cited by examiner

Primary Examiner—Minh Loan Tran
Assistant Examiner—Luan Thai
(74) Attorney, Agent, or Firm—Fitzpatrick, Cella, Harper & Scinto

(57) ABSTRACT

A moldless semiconductor device comprising a semiconductor chip held between outer-connecting terminals and connected electrically to the terminals is provided. At least one of the two terminals has, at its region contiguous to the semiconductor chip or at its region contiguous to the semiconductor chip and a region vicinal thereto, a hardness different from all other regions of the one terminal. This moldless semiconductor device can withstand significant external force and exhibits high reliability when used in photovoltaic device modules.

22 Claims, 12 Drawing Sheets

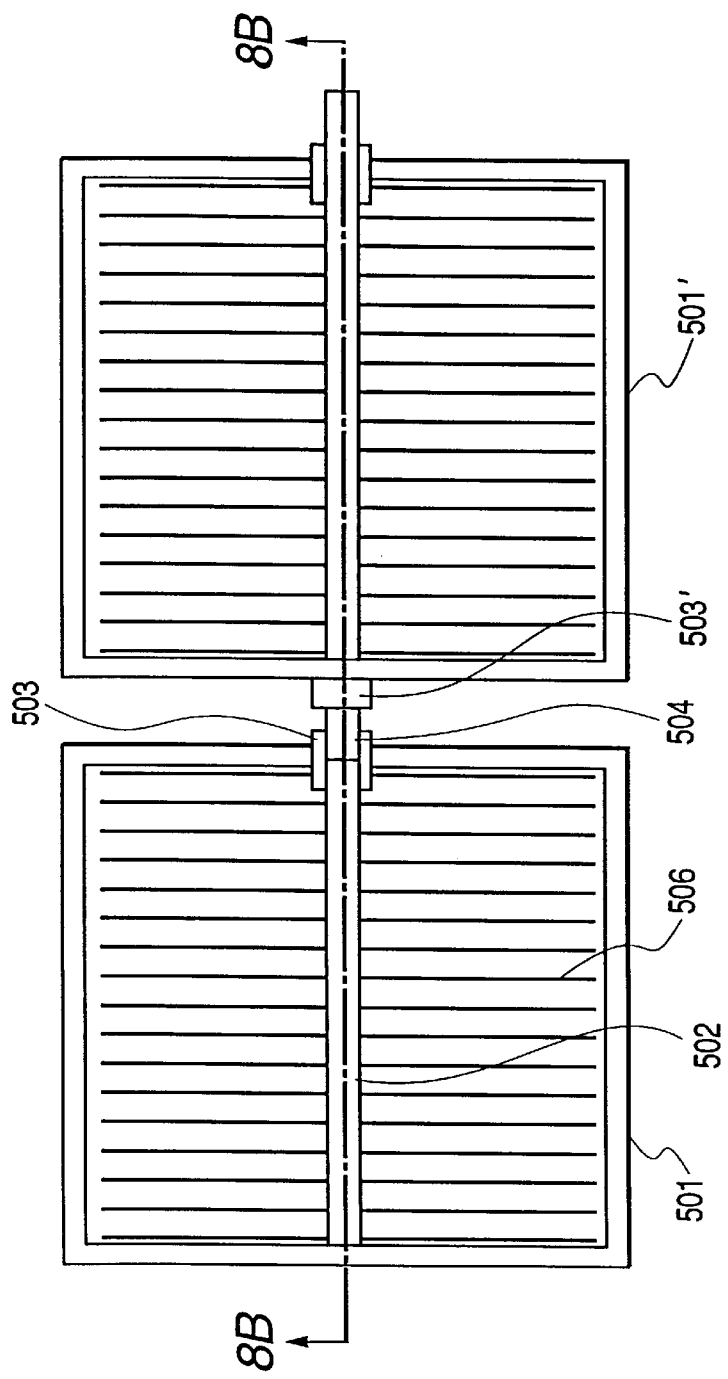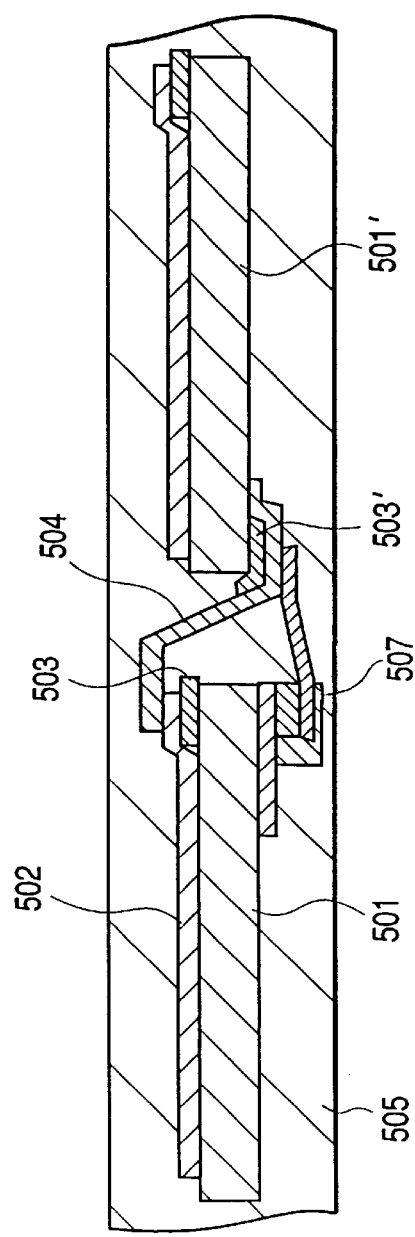
FIG. 8A
FIG. 8B

FIG. 9

| |
|---|
| 607 |
| 606 |
| 625 |
| 624 |
| 623 |
| 615 |
| 614 |
| 613 |
| 605 |
| 604 |
| 603 |
| 602 |
| 601 |

MOLDLESS SEMICONDUCTOR DEVICE AND PHOTOVOLTAIC DEVICE MODULE MAKING USE OF THE SAME

BACKGROUND OF THE INVENTION

1. Field of the Invention

This invention relates to a semiconductor device, and more particularly to a moldless semiconductor device, not covered with any mold resin. This invention also relates to a photovoltaic device module, a solar cell module and a construction material which make use of the moldless semiconductor device as a bypass diode.

2. Related Background Art

In recent years, it has been predicted that an increase in $CO_2$ which causes the greenhouse effect will make the earth's environment warm, and thus there is an increasing demand for clean energy that releases no $CO_2$. As an energy source that releases no $CO_2$, atomic power generation can be considered, but the problem of radioactive waster remains unsettled. Thus, a clean energy having a higher safety is desired. Under such circumstances, among clean energy sources, solar cells attract notice especially greatly in view of cleanliness, safety and readiness to handle.

As types of solar cells, many types of solar cells such as crystal type solar cells, amorphous type solar cells and compound semiconductor solar cells are the subject of research and development. In particular, the amorphous type solar cells, though not comparable to the crystal type solar cells with respect to conversion efficiency, indeed, can be made large-area with ease and also have a large light absorption coefficient and still also can operate in thin-film construction, having excellent features the crystal type solar cells do not, and are one type of solar cells considered to have a promising future.

Now, usually, a one-sheet solar cell alone has not a sufficient output voltage when solar cells are viewed as electric power supply sources. Hence, it is necessary to use a plurality of solar cells connected in series or in parallel.

The most difficult point in the case where a plurality of solar cells thus connected in series are operated is that, when cells are partly shut out from sunlight because of being shadowed by a building or because of snowfall to come to generate no electricity, the total voltage generated from other devices which are normally generating electricity is applied directly thereto in the form of a reverse voltage. Then, when such a reverse voltage reaches a value higher than the breakdown voltage of a device, there is a possibility of the break of the device. Accordingly, in order to avoid such a break of the device, a diode must be connected in parallel to the device in the reverse direction for each device of the devices connected in series. Such a diode is commonly called a bypass diode.

As bypass diodes, mold-packaged diodes provided with cover resin around them have commonly been used as general-purpose articles.

FIG. 1 schematically illustrates a conventional mold-packaged semiconductor device. Reference numeral 301 denotes a semiconductor chip; and 302 and 303, outer-connecting terminals connected electrically with the semiconductor chip 301 through a soldering material (not shown). Reference numeral 304 denotes a mold resin such as epoxy resin, which protects the semiconductor chip mechanically and plays simultaneously a role of preventing moisture from entering. Thus, the mold-packaged semiconductor device refers to a device whose semiconductor chip 301 is covered completely with the mold resin 304 and in which neither the semiconductor chip nor the outer-connecting terminals at their part adjacent to the semiconductor chip are laid bare at all. Namely, the outer-connecting terminals are seen from the outside only in part.

However, when such mold-packaged diodes are used as the bypass diodes of solar cells, there are the following difficult points.

(1) While a solar cell itself has a thickness of about 300 μm, even a mold-packaged diode having a small thickness has a thickness of about 1 mm. As the result, the solar cell has an extremely large thickness only at the part where the diode is provided, so that the flatness of a module is greatly damaged. To keep the flatness, a method may be used in which a covering material around the cell is made thick, which, however, results in a high cost for the covering material.

(2) Since the diode chip itself is covered completely with the mold resin, electric currents flowing through the diode chip may accelerate heat deterioration of the covering material around it because the diode has a very poor heat dissipation against the heat generated at the part of p-n junction of the chip. In an instance where a solar cell has a metal substrate as a component, the metal may be used as a fin. However, in the case of the mold-packaged diode, it is impossible for the chip portion to be brought into contact with the metal substrate because the chip is always covered with the mold resin, and there is also a limit to the improvement in heat dissipation.

Such a background has brought a proposal of constitution where the chip diode is used without any mold-packaging resin (hereinafter "moldless diode") as disclosed in, e.g., Japanese Patent Applications Laid-Open No. 5-291602 and No. 9-82865. In the case of the moldless diode, the flatness of the module can be kept because of a very small thickness of about 300 μm, and also the chip portion can come into contact with the metal substrate because there is no mold resin. Thus the heat dissipation can be improved.

FIGS. 2A and 2B schematically illustrate an example of such a moldless diode. FIG. 2A is a plan view, and FIG. 2B a cross-section along the line 2B—2B. In these drawings, reference numeral 201 denotes a semiconductor bare chip; 202 and 203, outer connecting terminals. The chip is connected electrically with the connecting terminals through a soldering material (not shown).

In such a conventional moldless semiconductor device, however, the chip portion is not covered completely, and hence it is very difficult to handle it, bringing about problems as discussed below.

(1) Because of the absence of a mold resin, the device is very fragile to torsional or bending force. Stated specifically, when the moldless diode is connected by soldering to a photovoltaic device, the outer-connecting terminals bend upon application of the torsional or bending force, and a shear stress is applied to the chip. As the result, the chip may have a residual stress and, in a serious instance, may break, where the reliability required as diodes is greatly damaged.

(2) Because of the absence of a mold resin, the device is very fragile to external force, in particular, to an impact force. As the result, the chip may break like the instance of (1).

(3) In a state where the moldless diode is connected to a photovoltaic device module or in a condition where the photovoltaic device module is installed on the roof surface of a house, the outdoor weather such as wind and hail may affect the photovoltaic device module itself to exert bend and impact repeatedly thereon. As the result, similar force may act also on the diode connected in the interior to cause the diode to break in some cases.

SUMMARY OF THE INVENTION

Objects of the present invention are to solve the above problems, to provide a moldless semiconductor device having a sufficient reliability against external force and also to provide a moldless semiconductor device having a high reliability even when the moldless semiconductor device is incorporated in a photovoltaic device module.

The above objects of the present invention can be achieved by a moldless semiconductor device comprising a semiconductor chip held between two outer-connecting terminals and connected electrically to the terminals, wherein at least one terminal of the two terminals has, at its region contiguous to the semiconductor chip or at its region contiguous to the semiconductor chip and a region vicinal thereto, a hardness made different from the hardness of the other region.

The hardness at the region contiguous to the semiconductor chip or at the region contiguous to the semiconductor chip and a region vicinal thereto, may preferably be made different from the hardness of the other region by 30 or more when expressed as Vickers hardness. With regard to the hardness of the respective regions, the present invention can be effective whichever region has a higher hardness. However, in particular, the region contiguous to the semiconductor chip, or the region contiguous to the semiconductor chip and a region vicinal thereto, may preferably be made to have a hardness higher than the hardness of the other region. Also, the other region may preferably have a hardness of 120 or less when expressed as Vickers hardness.

In the present invention, the semiconductor chip may be covered with an elastic material only in part. This elastic material may preferably comprise an organic high polymer resin having a hardness of 50 or less when expressed as JIS-A hardness. As the organic high polymer resin, silicone resin may be used, for example. The organic high polymer resin may preferably comprise a moisture-curing resin.

The above moldless semiconductor device may be use in a photovoltaic device module comprising a plurality of photovoltaic devices each having an electrode member, which are interconnected electrically through a connecting member; the moldless semiconductor device is connected in close contact with any one of the electrode member and the connecting member. Here, the moldless semiconductor device may preferably be provided on the non-light-receiving side of the photovoltaic devices. The photovoltaic device module may be so constructed as to have flexibility. The photovoltaic device module may also be worked by bending at least in part.

In the above photovoltaic device module, the plural photovoltaic devices may preferably be connected in series, the moldless semiconductor devices may preferably be in plurality and connected to the individual photovoltaic devices in parallel, and the semiconductor chip of each moldless semiconductor device may preferably comprise a diode.

The above photovoltaic device module may also be sealed with a resin between a surface covering material and a back covering material to make up a solar cell module. The photovoltaic device module may still also be sealed with a resin on a reinforcing plate and provided with a protective film on its surface, and the reinforcing plate may be worked by bending to make up a construction material.

The moldless semiconductor device of the present invention can operate in the following way.

(1) Since a semiconductor chip is held between two outer-connecting terminals and connected electrically to them and a hardness difference is provided in at least one pole side outer-connecting terminal between its semiconductor chip adjacent region (i.e., the region contiguous to the semiconductor chip, or the region contiguous to the semiconductor chip and a region vicinal thereto; the same applies hereinafter) and the other region, it is possible to provide a moldless semiconductor device which is resistant to torsional or bending forces. When the chip adjacent region has a hardness higher than that of the other region, the part on which the torsion acts chiefly is only the part other than the chip adjacent region, and hence any torsional stress may hardly be transmitted to the chip. Also when conversely the part other than the chip adjacent region has a hardness higher than that of the chip adjacent region, the stress is absorbed in the vicinity of a boundary of the region provided with the hardness difference, and hence the stress applied to the chip itself can be lessened. As the result, the semiconductor chip can be prevented from having a residual stress or from breaking. Thus it is possible to provide a highly reliable moldless semiconductor device which does not break even when the torsional or bending force acts thereon.

(2) Since a semiconductor chip is held between two outer-connecting terminals and connected electrically to them and a hardness difference is provided in at least one pole side outer-connecting terminal between its semiconductor chip adjacent region and the other region, and also since an elastic material may be so disposed as to cover at least part of the semiconductor chip, any external stress applied thereto can be absorbed by the elastic material and any external force and impact force transmitted to the chip can be relaxed. As the result, the semiconductor chip can be free from breaking.

(3) In the case of a semiconductor device incorporated with both of the above features (1) and (2), it is possible to also provide a moldless semiconductor device which is durable to both the torsional or bending force and the impact force.

(4) Since the hardness difference may be provided by 30 or more in Vickers hardness, more remarkable stress relaxation can be expected.

(5) Since the outer-connecting terminal may have a higher hardness at its semiconductor chip adjacent region than at the other region, the device can be made more effectively durable to the torsional or bending force.

(6) Since the Vickers hardness at the part other than the semiconductor chip adjacent region may be 120 or less, the outer-connecting terminal can be soft almost in its entirety and can better absorb the torsional force. Also, it becomes possible to work the outer-connecting terminal freely so as to be used in a bent form, and it is possible to provide a moldless semiconductor device having a broad range of application.

(7) Since the elastic material may be an organic high polymer resin having a hardness of 50 or less (JIS-A hardness), it is possible to provide a moldless semiconductor device having a very high stress absorption.

(8) When the organic high polymer resin is silicone resin, it is possible to provide a moldless semiconductor device having a stretchability and also a high heat resistance.

(9) In addition, when the organic high polymer resin is of a moisture-curing type, the resin can be cross-linked by allowing it to stand at room temperature, and hence, for example, the outer-connecting terminal can be free from being heated and can be free from being oxidized extremely.

(10) In the case of the photovoltaic device module in which the moldless semiconductor device described above is connected in close contact with an electrode member of a photovoltaic device or with a connecting member electrically interconnecting photovoltaic devices, it is possible to provide a photovoltaic device module which is resistant to external force. At the same time, since it is connected in close contact therewith, the photovoltaic device itself can be utilized as a fin, thus any temperature rise can be made smaller when electric currents flow through the semiconductor device.

(11) Since the moldless semiconductor device may be connected to the electrode member or connecting member on the non-light-receiving side of the photovoltaic devices, the device can be made to have a higher resistance to any external force (e.g., hail) coming from the light-receiving side.

(12) When the photovoltaic device module has a flexibility, the semiconductor device can better exhibit durability to torsional or bending force.

(13) When the photovoltaic device module is worked by bending in part or on the whole, it is possible to provide a photovoltaic device module having a high durability also to the external force applied during the working.

(14) In a construction material integral type photovoltaic device module having the photovoltaic device module and a construction material in integral structure, it is possible to provide a module having a high reliability also against the effects of weather such as wind and rain.

BRIEF DESCRIPTION OF THE DRAWINGS

FIGS. 8A and 8B are a plan view and a cross-sectional view which illustrate schematically a photovoltaic device module employing the moldless semiconductor device of the present invention.

FIG. 9 is a cross-sectional view illustrating the layer configuration of a photovoltaic device used in the photovoltaic device module.

DESCRIPTION OF THE PREFERRED EMBODIMENTS

Figure 1:
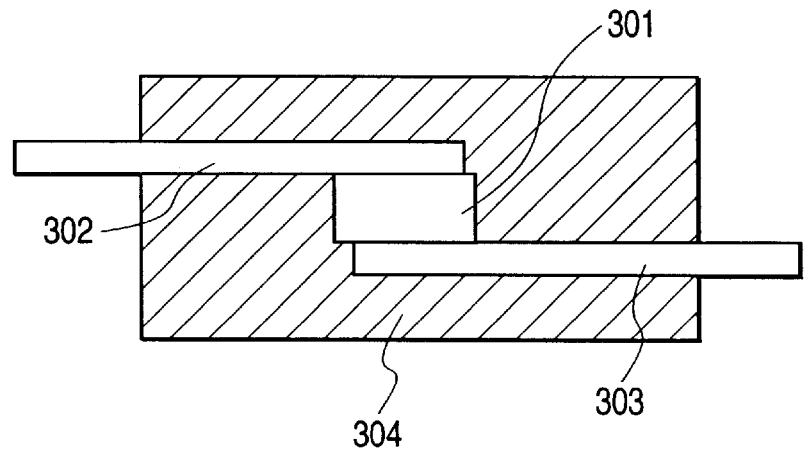
FIG. 1 is a cross-sectional view illustrating schematically a conventional mold-packaged semiconductor device.
Figure 2A:
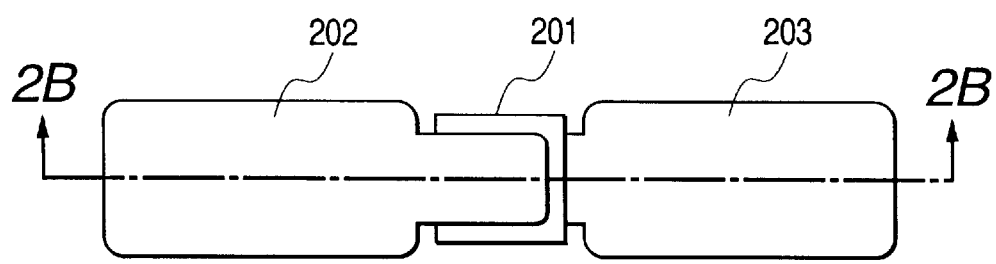
FIGS. 2A and 2B are a plan view and a cross-sectional view which illustrate schematically a conventional moldless semiconductor device.
Figure 2B:
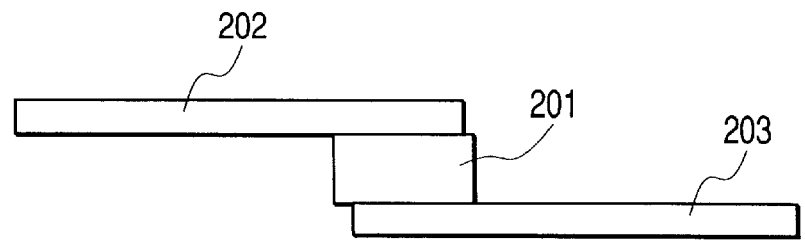
Figure 3A:
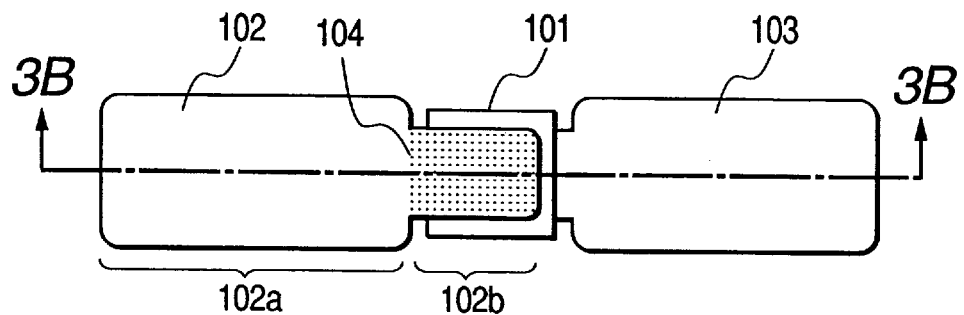
FIGS. 3A and 3B are a plan view and a cross-sectional view which illustrate schematically a first embodiment of the moldless semiconductor device of the present invention.
Figure 3B:
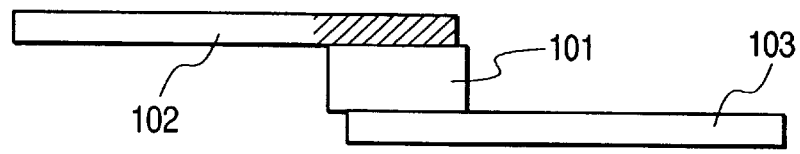

FIGS. 3A and 3B illustrate a first embodiment of the moldless semiconductor device of the present invention. FIG. 3A is a plan view of the moldless semiconductor device and FIG. 3B is its cross-sectional view along the line 3B—3B. In FIGS. 3A and 3B, reference numeral 101 denotes a semiconductor chip, and 102 and 103 each denote an outer-connecting terminal.

In this first embodiment, the outer-connecting terminal 102 is provided with a hardness difference between its region 102b contiguous to the semiconductor chip 101 and the other region 102 along a boundary line 104. Namely, the region 102b (shaded) contiguous to the semiconductor chip 101 and the other region 102a differ in their hardness.

Figure 4A:
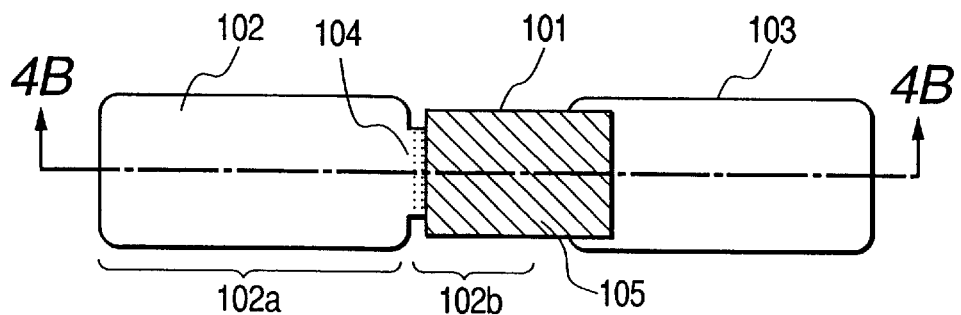
FIGS. 4A and 4B are a plan view and a cross-sectional view which illustrate schematically a second embodiment of the moldless semiconductor device of the present invention.
Figure 4B:
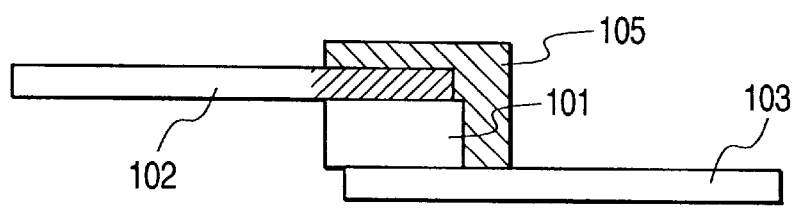

FIGS. 4A and 4B illustrate a second embodiment of the moldless semiconductor device of the present invention. FIG. 4A is a plan view of the moldless semiconductor device, and FIG. 4B is its cross-sectional view along the line 4B—4B. In FIGS. 4A and 4B, the same members are denoted by the same reference numerals used in FIGS. 3A and 3B to omit detailed description.

The second embodiment is different from the first embodiment in that the semiconductor chip 101 is covered with an elastic material 105 in part. In the second embodiment, too, the region 102b (hatched) contiguous to the semiconductor chip 101 and the other region 102a differ in their hardness.

What is defined as the moldless semiconductor device in the present invention refers to the one not covered with any mold resin at all as shown in FIGS. 3A and 3B, or the one in which as shown in FIGS. 4A and 4B an elastic material is placed only in part and the device is not covered completely, where the semiconductor chip or the outer-connecting terminals adjacent to the semiconductor chip is always laid bare.

The moldless semiconductor device of the present invention may preferably be used, in particular, as a bypass diode in photovoltaic device modules, and besides may be used as the semiconductor chip 101 in semiconductor devices such as transistors, ICs and thyristors.

In the case where the semiconductor chip constitutes a diode, applicable are various types of diodes such as detector diodes, rectifier diodes, Esaki diodes (tunnel diodes), constant-voltage diodes, variable-capacitance diodes and switching diodes without limitation. With regard to their chip structure, mesa structure and planar structure may be used without limitation. In the case where the outer-connecting terminals are connected in parallel as in the first and second embodiments, it is preferable to use the mesa structure in order to prevent shorts from occurring between the outer-connecting terminal and the chip.

As the outer-connecting terminals 102 and 103 connected to the semiconductor chip 101 through a soldering material or the like, preferably used are materials that can be joined with the soldering material, that have good electrical conductivity and that have a small thermal resistance. For example, gold, silver, copper and nickel are preferred. To make electrical conductivity smaller, it is preferable for the outer-connecting terminals to have a larger thickness, but those which are too thick make the entire thickness large, resulting in loss of the original feature as thin type. Hence, the terminal may preferably be from 35 to 150 microns thick.

There are also no particular limitations on the shapes of the outer-connecting terminals 102 and 103. In order to improve heat dissipation, the outer-connecting terminal on the side where it is attached to fins may preferably have a larger size than the other.

Figure 5:
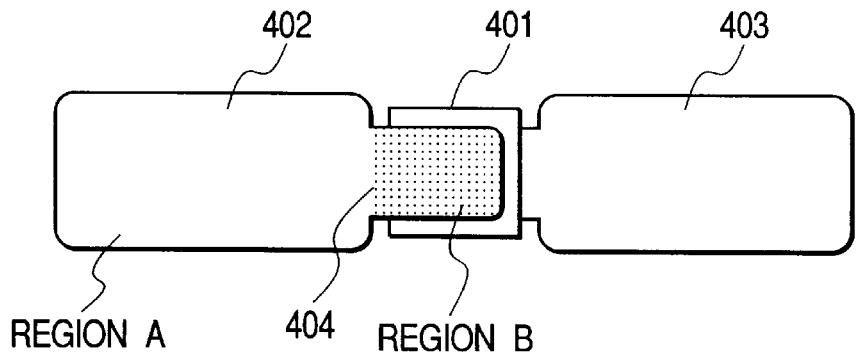
FIG. 5 is a plan view of the first embodiment of the moldless semiconductor device of the present invention.
Figure 6:
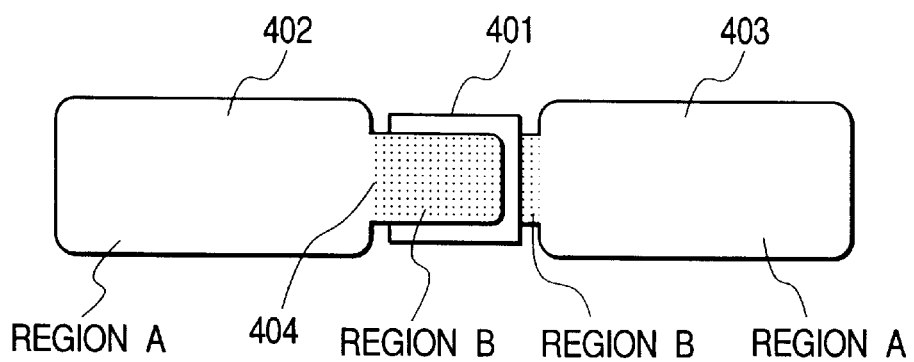
FIG. 6 is a plan view of a third embodiment of the moldless semiconductor device of the present invention.
Figure 7:
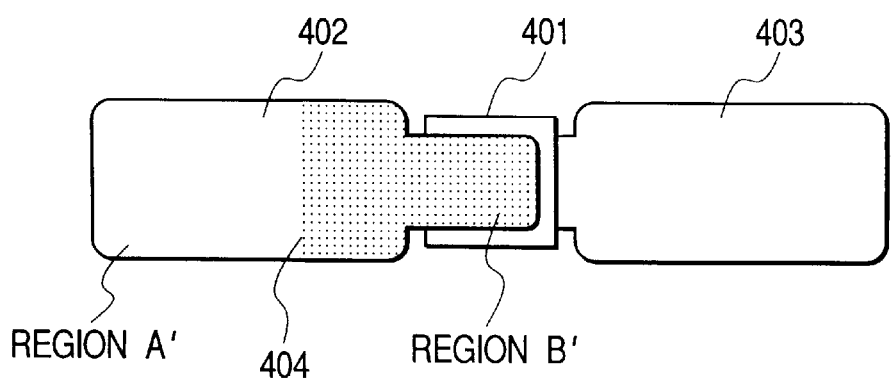
FIG. 7 is a plan view of a fourth embodiment of the moldless semiconductor device of the present invention.

The manner of parting the regions having different hardness in the outer-connecting terminal will be described below with reference to FIGS. 5 to 7. In FIGS. 5 to 7, reference numeral 401 denotes a semiconductor chip; 402 and 403 each an outer-connecting terminal; and 404 a boundary line that divides the regions having different hardness.

FIG. 5 illustrates an embodiment like the first embodiment. The outer-connecting terminal 402 has region B (shaded) contiguous to the semiconductor chip 401 and the other region, region A, along the boundary line 404, and these regions A and B have a hardness different from each other.

FIG. 6 illustrates a third embodiment of the present invention. In the third embodiment, not only the outer-connecting terminal 402 but also the other outer-connecting terminal 403 have region B (shaded) contiguous to the semiconductor chip 401 and the other region, region A, and these regions A and B have a hardness different from each other.

FIG. 7 illustrates a fourth embodiment of the present invention. In the embodiment shown in FIG. 5, the region B is set in a region substantially contiguous to the semiconductor chip, but in this fourth embodiment the region contiguous to the semiconductor chip and its vicinal region are set as region B', and the other region as region A'. Then, these regions B' and A' have a hardness different from each other.

In the embodiments shown in FIGS. 5 to 7, in the case where the region B contiguous to the semiconductor chip, or the region contiguous to the semiconductor chip and its vicinal region (i.e., region B'), has a hardness higher than that of the other region (region A or A'), even if torsional or bending stress is applied to the terminal having the region A or A', the stress is absorbed in the vicinity of the boundary line 404 and may hardly be transmitted to the region A or A', because the region B or B' has a higher hardness. Also in the case where conversely the region A or A' has a higher hardness than the region B or B', the stress is absorbed likewise in the vicinity of the boundary line 404 and may hardly be transmitted to the chip 401. Because of the operational effect attributable to these, it is possible to provide a moldless semiconductor device which is tough to torsion or bend, when a hardness difference is provided between the semiconductor chip adjacent area and the other area.

In either case, the effect of lowering stress can be expected. Since, however, the region B or B' is connected directly with the semiconductor chip 401, it is more effective and more preferable to make the chip adjacent region (region B or B') have a higher hardness.

The value of hardness can be expressed by Vickers hardness. The greater the hardness difference is, the more greatly effective and preferable. In a preferred embodiment, it is preferable to provide a hardness difference of 30 or more in Vickers hardness.

Semiconductor devices are applied in so wide a range that they are required to be attached to places having various shapes. Under such circumstances, the part other than the chip adjacent region (region A or A') may have a Vickers hardness of 120 or less so that the region A or A' can be bent when used. If it has a Vickers hardness of more than 120, that part tends to break off or crack when bent and the terminals may break in a condition of long-time use. Accordingly, it may preferably have a hardness of 120 or less, and more preferably 80 or less.

As means for providing the hardness difference, the hardness difference may be provided by softening partly a member having a high hardness or may be provided by hardening partly a member having a low hardness. The latter can commonly provide the hardness difference by a simple method. Specific means therefor may include, but are not particularly limited to, a method in which a different material is provided by, e.g., metal plating, metal vapor deposition or rigid-film coating, and a method in which the surface itself is modified by ion implantation or the like. In particular, the metal plating has advantages that such a different material can be formed by a simple method because no vacuum system is required and also can be formed at a high growth rate. As metals used, silver, aluminum, nickel and solder may be used, but without limitation thereto. When the different material is provided on the surface, it may be provided on one side of the outer-connecting terminal or may be provided on both sides.

The elastic material used in the second embodiment described previously will be detailed below. The purpose for which the elastic material is placed is to improve the durability of the semiconductor chip to external force such as pressure and impact force. However, in the present invention, it is so provided as to cover only part of the semiconductor chip 101. As materials therefor, materials which are relatively soft and are rich in cushioning properties are preferably used, and there are no particular limitations. For example, various rubber type resins, foamed resins and elastic resins may be used. As to their form, they may be used in various forms including molten or solution resins, films, rubbery resins, adhesives and tapes.

The foamed resins may preferably include, e.g., those produced by blowing a resin at a high magnification to make elasticity higher. As to their shape, those having the shape of a tape can be attached with ease and are preferred. As base materials of the foamed resins, usable are, e.g., polystyrene, vinyl chloride, polyethylene, polyvinyl alcohol, polyurethane, acrylic and silicone resins.

In the case of resins having an elasticity, a resin melted or dissolved, a resin having the shape of an adhesive or a potting resin is so applied by dotting as to cover only part of the chip by means of, e.g., a dispenser, followed by curing with energy as exemplified by heat, moisture or ultraviolet rays. In particular, moisture-curing resins are more preferred because of an advantage that the product can be obtained by a simple process such as leaving at normal temperature and an advantage that the terminals can be soldered with ease in a post step because the outer-connecting terminals are almost not oxidized.

In order to make impact resistance higher, the elasticity of a resin after curing is the most effective factor, and, the higher the elasticity is, the higher the impact resistance becomes. The factor of elasticity can be expressed by JIS-A hardness. A JIS-A hardness of from 5 to 50 is preferred. If the elastic material has a too high elasticity, it may greatly collapse in the step of covering the photovoltaic device with resin later, and the film thickness of the elastic material itself may become very small. Thus, a hardness of 5 or more is preferred. An elastic material having a hardness of 50 or less is preferred because of its higher impact resistance from an experimental viewpoint. Typical resins may include, but not limited to, silicone resins, urethane resins and butyl rubbers. In particular, silicone resins, having a high thermal resistance, are more preferred in order to respond to temperature rises occurring when electric currents flow through the semiconductor chip.

The above resin comes into direct contact with the semiconductor chip, and hence the resin may preferably contain impurity ions as minimally as possible also in order to maintain electrical properties of the semiconductor chip. Those containing sodium ions, potassium ions and chlorine ions each in an amount of 2 ppm or less are preferred.

When mass productivity is taken into account, the resin may preferably have a viscosity high enough to be applied by dotting by means of a dispenser. Those having a too low viscosity may spread greatly to cause a difficulty that the resin can not be applied by dotting at specified places. Also, those having a too low viscosity may heap thin so excessively as to result in a weak elasticity. Taking account of even balance of these, the resin may preferably have a viscosity of from 500 poises to 2,000 poises before its cure.

As to the impact resistance achieved when the elastic material is formed, its effect greatly depends on the hardness of the elastic material, and also depends on the film thickness of a finished elastic material. The larger film thickness the elastic material has, the higher impact resistance it has as a matter of course. However, those having a too large thickness may make it hard to solder the semiconductor device or impossible to mount it on a thin-type packaging substrate. Accordingly, the elastic material may preferably be controlled to have an appropriate thickness according to purposes for which it is used. When it is joined with photovoltaic devices, it may preferably have a thickness of 1 mm or less at most.

An example in which the moldless semiconductor device of the present invention is applied as a bypass diode of a photovoltaic device will be given below.

-Photovoltaic Device-

The photovoltaic device in the present invention may be used in single crystal, thin-film single crystal, polycrystalline or amorphous silicon solar cells, and besides may be used in solar cells making use of a semiconductor other than silicon and in Schottky junction type solar cells.

FIGS. 8A and 8B illustrate schematically a photovoltaic device module of the present invention and show, as a typical example, a photovoltaic device module employing an amorphous silicon solar cell. FIG. 8A is its plan view, and FIG. 8B its cross-sectional view along the line 8B—8B, showing a state where the photovoltaic device module is sealed with resin between a surface covering material and a back covering material. Reference numerals 501 and 501' denote photovoltaic devices; 502, a bus bar electrode; 503 and 503', insulating members; 504, a metal member (a connecting member); 505, a covering material; 506, a collector electrode; and 507, a semiconductor device (diode) like the one shown in any of FIGS. 3A to 7. Two photovoltaic devices 501 and 501' are electrically interconnected in series through the metal member 504, and the insulating members 503 and 503' are provided on the photovoltaic devices at the areas where their edges and the metal member 504 come in contact.

As shown in FIGS. 8A and 8B, the semiconductor device 507 is connected electrically in parallel with respect to the photovoltaic device 501. One of the outer-connecting terminals is connected in close contact with the photovoltaic device 501, and the other is connected to the connecting member 504. The semiconductor device 507 may cause, due to heat generation by itself, thermal deterioration of the surrounding covering material 505. Hence, as shown in FIGS. 8A and 8B, it is connected in close contact with the photovoltaic device 501, and the photovoltaic device 501 is utilized as a fin. As the part at which the semiconductor device 507 is connected, the one shown in FIGS. 8A and 8B is brought into close contact with the photovoltaic device 501. Stated in greater detail, it may preferably be connected to a metal such as a metal substrate or a lower electrode as will be described later. As the part other than the photovoltaic device, it may also be connected in close contact with the metal connecting member 504 or may be connected onto the bus bar electrode on the surface side, where the like effect can be exhibited.

As described above, the semiconductor device may be connected to either of the surface side and back side of a photovoltaic device. In an instance where it is connected on the back side, the covering material on the surface can be made to have a sufficiently large thickness. Hence, the covering material itself present on the surface serves also as a cushioning material and can be made more highly durable to external force (e.g., stepping and static loading) acting on the photovoltaic device from the surface side. In contrast, in an instance where the semiconductor device is disposed on the surface side, the part corresponding to the semiconductor device protrudes to the surface when the surrounding of the photovoltaic device is filled with the covering material, so that the covering material on the semiconductor device has a thin thickness. In view of the foregoing points, the semiconductor device may more preferably be connected to the electrode member on the non-light-receiving side of the photovoltaic device or to the connecting member on the non-light-receiving side thereof.

With regard to the number of the devices to be connected, it is preferable to connect one or more semiconductor devices for each photovoltaic device in order to make output power decrease less when the photovoltaic device is shadowed. From the standpoint of cost, one semiconductor device may be connected to a plurality of photovoltaic devices.

It is more effective for the photovoltaic device module to have a flexibility. More specifically, since the photovoltaic device module has a flexibility, bending or torsional force acts on the semiconductor devices connected to the photovoltaic devices. In such an instance, a semiconductor device free from breakage and having a high reliability can be provided by beforehand connecting the semiconductor device of the present invention. In other words, the semiconductor device of the present invention can be used efficiently when used in a flexible photovoltaic device module.

The semiconductor device of the present invention can be very effective also when a solar sell module comprising such a photovoltaic device module having a flexibility, sealed with resin on a reinforcing plate, is worked by bending. The solar sell module of the present invention may be worked in a variety of manners, e.g., by folding its edges or bending the whole to have a wavy shape. Thus, modules with various shapes can be provided. Such modules can also be used in construction materials. When worked, external force acts on the photovoltaic device and semiconductor device. For example, commonly available working means may include a molding press, a roller former and a bender, where a press applies a pressure to the module when molded by the molding press or rollers pass on the surface of a module when the roller former is used. The semiconductor device of the present invention is highly durable to the action of such external force. Thus, it is possible to provide a photovoltaic device module or solar cell module which by no means breaks even when worked and has a high reliability.

The photovoltaic device will be described below in detail.

FIG. 9 is a diagrammatic cross-sectional view for illustrating the photovoltaic devices 501 and 501' in greater detail. In FIG. 9, reference numeral 601 denotes a substrate; 602, a lower electrode; 603, 613 and 623, n-type semiconductor layers; 604, 614 and 624, i-type semiconductor layers; 605, 615 and 625, p-type semiconductor layers; 606, an upper electrode; and 607, a collector electrode.

The substrate 601 is a member that supports mechanically the semiconductor layers in the case of a solar cell comprising a thin film such as amorphous silicon film and is also used as an electrode. According, the substrate 601 is required to have a thermal resistance high enough to withstand the temperature of heat applied when semiconductor layers are formed, but may be either conductive or electrically insulating.

Conductive materials include, e.g., metals such as Fe, Ni, Cr, Al, Mo, Au, Nb, Ta, V, Ti, Pt and Pb or alloys of any of these, thin sheets of, e.g., brass or stainless steel, composites thereof, carbon sheets, and galvanized steel sheets. Electrically insulating materials include films or sheets of heat-resistant synthetic resins such as polyester, polyethylene, polycarbonate, cellulose acetate, polypropylene, polyvinyl chloride, polyvinylidene chloride, polystyrene, polyamide, polyimide and epoxy; composites of any of these with glass fiber, carbon fiber, boron fiber, metal fiber or the like; and thin sheets of any of these metals or resin sheets whose surfaces have been subjected to surface coating by sputtering, vapor deposition or plating to form thereon metal thin films of different materials and/or insulating thin films of $SiO_2$, $Si_3N_4$, $Al_2O_3$ or AlN; and also glass and ceramics.

The lower electrode 602 is one electrode through which the electric power generated in the semiconductor layers is withdrawn and is required to have a work function that may serve as an ohmic contact with respect to the semiconductor layers. Materials therefor may include single metals, alloys and transparent conductive oxides (TCO), as exemplified by Al, Ag, Pt, Au, Ni, Ti, Mo, Fe, V, Cr, Cu, stainless steel, brass, nichrome, $SnO_2$, $In_2O_3$, ZnO and ITO. The lower electrode 602 may preferably have a flat surface, but may be texture-treated on its surface when irregular reflection of light occurs. In the case where the substrate 601 is conductive, it is not especially necessary to provide the lower electrode 602.

The lower electrode may be produced by, e.g., using a process such as plating, vapor deposition or sputtering. As the amorphous silicon semiconductor layers, not only a triple construction having the p-i-n structures as shown in FIG. 9 but also a double construction formed by superposing p-i-n structures or p-n structures or a single construction of p-i-n or p-n structure may preferably be used. Semiconductor materials constituting especially the i-layers 604, 614 and 624 may include what is called Group IV and Group IV alloy type amorphous semiconductors such as a-Si and besides a-SiGe and a-SiC. The amorphous silicon semiconductor layers may be formed by a known process such as vapor deposition, sputtering, high-frequency plasma enhanced CVD (chemical vapor deposition), microwave plasma enhanced CVD, ECR (electron cyclotron resonance) process, thermal CVD or LPCVD (low-pressure CVD), any of which may be used as desired. As a film-forming apparatus, a batch type apparatus or a continuous film-forming apparatus may be used as desired.

The upper electrode 606 is an electrode through which the electrical energy generated in the semiconductor layers is withdrawn and makes a pair with the lower electrode 602. The upper electrode 606 is necessary when semiconductors having a high sheet resistance as in amorphous silicon are used and is not especially necessary in crystal type solar cells because of their low sheet resistance. Since the upper electrode 606 is located on the light-incident side, it must be transparent and is also called a transparent electrode in some cases. The upper electrode 606 may preferably have a light transmittance of 85% or more so that the light from the sun or white fluorescent lamps can be absorbed in the semiconductor layers in a good efficiency. With regard to electrical properties, it may also preferably have a sheet resistivity of 100 ohms per square so that the electric currents generated by light can flow in the lateral direction with respect to the semiconductor layers. Materials having such properties may include, e.g., metal oxides such as $SnO_2$, $In_2O_3$, ZnO, CdO, $CdSnO_4$, and ITO ($In_2O_3+SnO_2$).

The collector electrode 607 corresponds to the electrode 506 shown in FIG. 8A, and is commonly formed in a comb, and its preferable width and pitch are determined on the basis of the values of sheet resistivities of the semiconductor layers and upper electrode. The collector electrode is required to have a low resistivity so as not to form series resistance in the solar cell. It may preferably have a resistivity of from $10E^{-2}$ Ω·cm to $10E^{-6}$ Ω·cm. As materials for the collector electrode, usable are, e.g., metals such as Ti, Cr, Mo, W, Al, Ag, Ni, Cu, Sn and Pt, or alloys of any of these, and solders. It is common to use metal paste comprising a pasty mixture of metal powder and a high-polymer resin. Examples are by no means limited to these.

-Bus Bar Electrode-

The bus bar electrode 502 shown in FIGS. 8A and 8B plays a role as a collector for further collecting to one end the electric currents flowing through the grid electrode 506. From such a viewpoint, materials used in the bus bar may preferably be materials having a low volume resistivity and also supplied stably in an industrial scale. Among such materials, copper may preferably be used as having a good workability and being inexpensive.

In the case where copper is used, a thin metal layer may be provided on the surface for the purposes of preventing corrosion and preventing oxidation. Such a surface metal layer may preferably be formed using, e.g., a minimally corrosive noble metal such as silver, palladium, a palladium-silver alloy or gold, or a substantially corrosion-resistant metal such as nickel, solder or tin. As a process for forming the above surface metal layer, for example, vapor deposition, plating or cladding may preferably be used, by which it can be formed relatively with ease.

The bus bar may preferably have a thickness of from 50 $\mu$m to 200 $\mu$m. Its formation in a thickness larger than 50 $\mu$m makes it possible to ensure a cross-sectional area large enough to respond to the density of electric currents generated in the photovoltaic device and also makes it possible to use it substantially as a mechanical linking member. Meanwhile, a thicker bus bar may cause resistance loss to a lesser degree, and, when formed in a thickness of 200 $\mu$m or less, it can be covered smoothly with the surface covering material.

The bus bar may be provided in any number of strips depending on the form of the substrate and is by no means limited to one strip. As the bus bar used here, those having substantially the same length as the size of the substrate on which it is to be provided may preferably be used. There are no particular limitations also on its shape. Columnar or foil-like bus bars may be used.

-Metal Member-

The metal member 504 shown in FIGS. 8A and 8B is a member to interconnect the photovoltaic devices (501 and 501') electrically or mechanically. When it interconnects them electrically in series, one end of the metal member 504 is connected with the bus bar electrode on one photovoltaic device 501 by a process such as soldering, and the other end thereof is connected with the other photovoltaic device 501' on its back side. When it interconnects them in parallel, one end of the metal member 504 is connected with a bus bar 502 on one photovoltaic device 501 by a process such as soldering, and the other end thereof is connected with a bus bar 501' on the other photovoltaic device 501'.

In the present example, the photovoltaic devices are interconnected using the metal member, but may be interconnected as they are, using the bus bar 502 without any problems. Materials used for the metal member, its shape and thickness may basically be entirely the same as those described in detail in the paragraph concerning the bus bar.

-Covering Material-

The covering material 505 will be described below. The covering material 505 used in the present invention is grouped roughly into three kinds, a surface covering material, a filler and a back covering material.

As properties required for the surface covering material, the material is required to have light transmission properties and weatherability and to be contamination resistant. When glass is used as its material, there is a problem that short filling may occur unless the filler is thick. Also, the use of glass not only results in a great weight but also may cause concern in that the glass tends to break upon external impact. Accordingly, a weather-resistant transparent film may preferably be used in the surface covering material. The use of such a film improves filling and makes the module lightweight and free from breakage due to impact. Moreover, an additional effect is the prevention of surface-reflected sunlight from glaring. Materials usable therefor may include, but are not limited to, fluorine resin films such as polyethylene tetrafluoroethylene (ETFE) film, polytrifluoroethylene film and polyvinyl fluoride film. Its surface to which the filler is bonded may be subjected to surface treatment such as corona discharge treatment so that the filler can be readily bonded.

Properties required for the filler may include weatherability, thermoplasticity, thermal adhesive properties and light transmission properties. Materials usable therefor may include, but are not limited to, transparent resins such as EVA (ethylene-vinyl acetate copolymer), butyral resin, silicone resin, epoxy resin and fluorinated polyimide resin. A cross-linking agent may be added to cross-link it. Also, in order to restrain photodeterioration, an ultraviolet light absorber may preferably be contained in it. Glass fiber nonwoven fabric or silica may also be incorporated in the filler so that scratch resistance can be improved.

The back covering material is used to cover the back side of the photovoltaic device module in order to keep electrical insulation between the photovoltaic device module and the outside. It is preferable to use materials that can ensure a sufficient electrical insulation, and besides have an excellent long-term durability and a flexibility high enough to withstand impact, scratching, thermal expansion and thermal constriction, as qualities required therefor. As materials preferably usable, plastic films such as nylon film and polyethylene terephthalate (PET) film may be used. Because of such constitution, the photovoltaic device module of the present invention can be used in flexible modules.

Even the filler alone can keep the electrical insulation, but tends to have uneven thickness, and hence there is a possibility of causing a short circuit between the photovoltaic device module and the outside at the part having a small film thickness and at the part of pinholes. The back covering material is used to prevent it.

A metallic, steel sheet may also be used in the back covering material. Materials usable therefor may include, but are not limited to, stainless steel sheets, coated steel sheets and galvanized steel sheets. In this instance, it is difficult to keep the electrical insulation between the photovoltaic device and the outside, and hence an insulating film may be provided between the photovoltaic device and the steel sheet to make up the back covering material. As the insulating film used here, plastic films such as nylon film and polyethylene terephthalate (PET) film may be used.

Figure 10A:
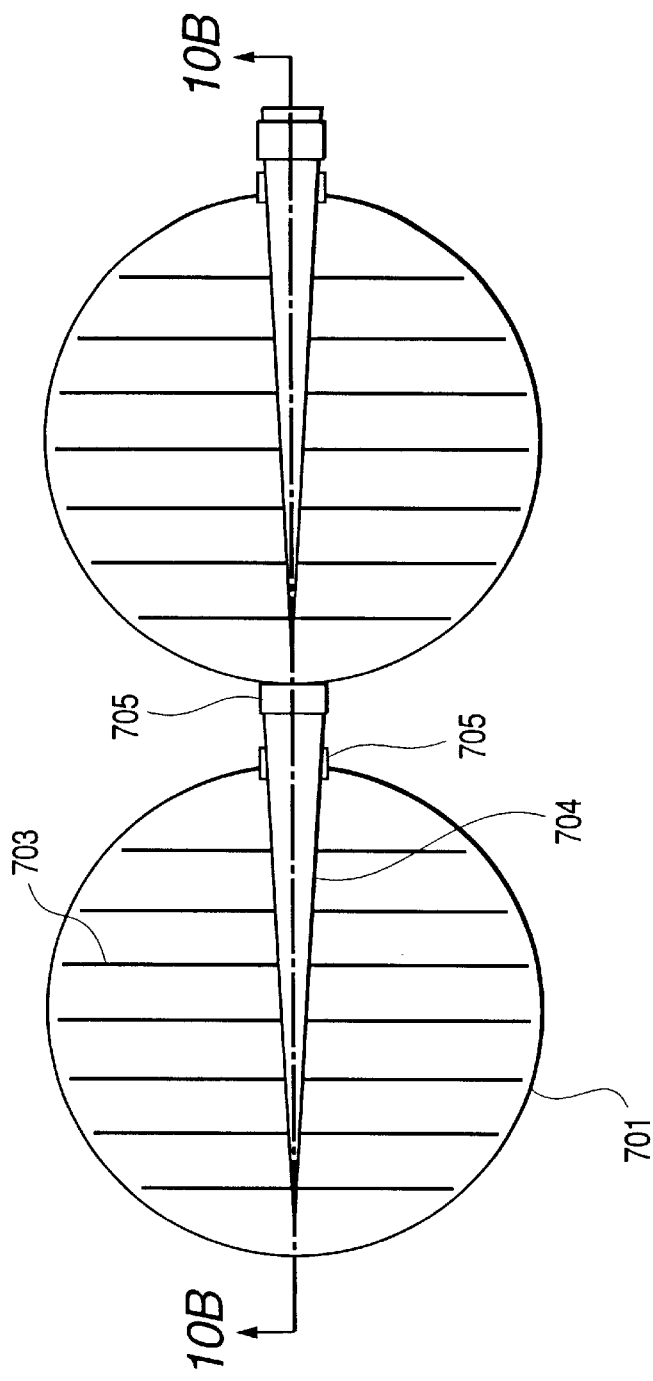
FIGS. 10A and 10B are a plan view and a cross-sectional view which illustrate schematically a crystal type solar cell module employing the moldless semiconductor device of the present invention.
Figure 10B:
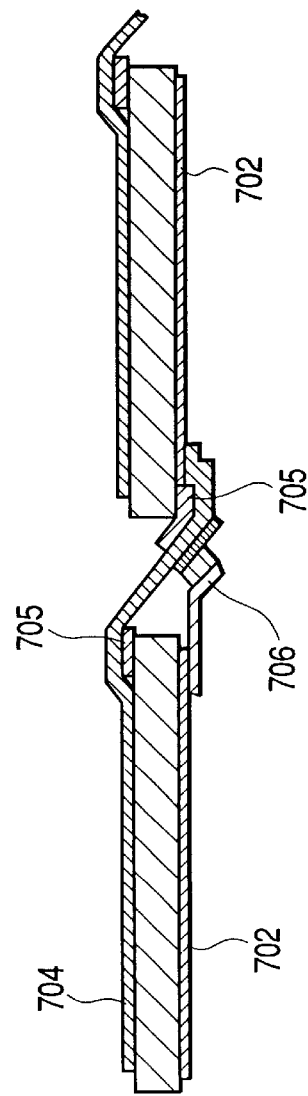

FIGS. 10A and 10B are diagrammatic schematic illustrations of an instance where a solar cell of crystal silicon such as single crystal silicon or polycrystalline silicon is used. FIG. 10A is a plan view, and FIG. 10A a cross-sectional view along the line 10B—10B. Reference numeral 701 denotes a photovoltaic device comprising a silicon substrate and a semiconductor layer having p-n junction; 702, a back electrode; 703, a collector electrode; 704, a bus bar electrode; 705, an insulating member; and 706, the semiconductor device according to the present invention.

In the case of single crystal silicon solar cells or polycrystalline silicon cells, any supporting substrates are not provided, and single crystal wafers or polycrystalline wafers serve as substrates. Single crystal wafers can be obtained by slicing a silicon ingot pulled up by the CZ (Czochralski) method. In the case of polycrystalline wafers, they can be formed by a method in which a silicon ingot obtained by the cast method is sliced or a method in which a sheet-like polycrystal is obtained by the ribbon method. The p-n junction may be formed by a process as exemplified by gaseous phase diffusion making use of $POCl_3$, coating diffusion making use of $TiO_2$, $SiO_2$ or $P_2O_5$, or ion implantation to dope with ions directly. Thus the semiconductor layer 701 is obtained. The back electrode 702 may be formed by, e.g., forming a metal film by vapor deposition or sputtering, or by screen printing of a silver paste. On the surface side of the semiconductor layer 701, an anti-reflection layer (not shown) is formed in some cases in order to prevent efficiency from decreasing because of the reflection of light. Materials usable therefor may include, e.g., $SiO_2$, $Ta_2O_5$ and $Nb_2O_5$.

With regard to the semiconductor device 706 connected as shown in FIGS. 10A and 10B, it may be connected in the same manner as the semiconductor device used in the case of the amorphous silicon solar cell described with reference to FIGS. 8A and 8B.

Figure 11:
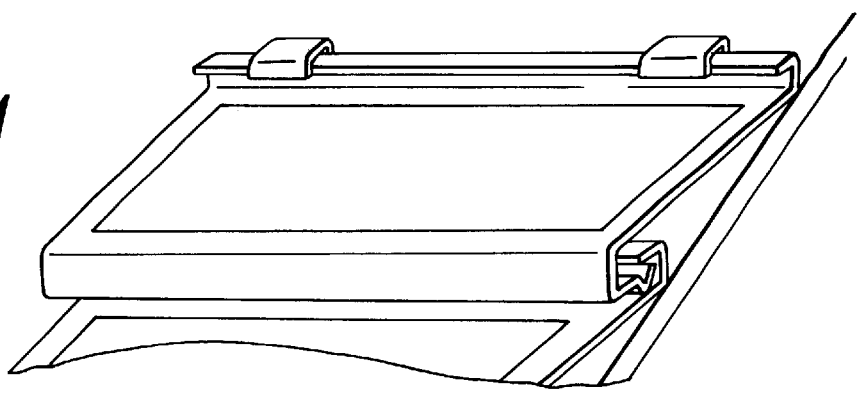
FIG. 11, FIG. 12 and FIG. 13 are each a perspective view showing an example of the constitution of a construction material employing the moldless semiconductor device of the present invention.
Figure 12:
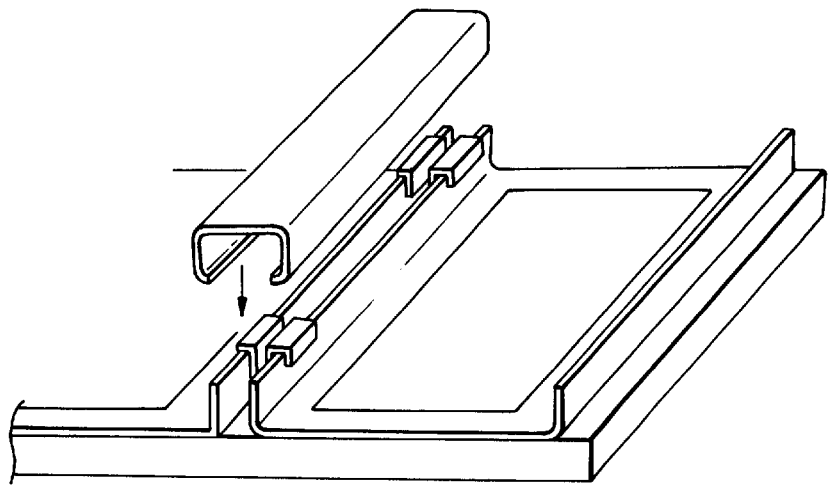
Figure 13:
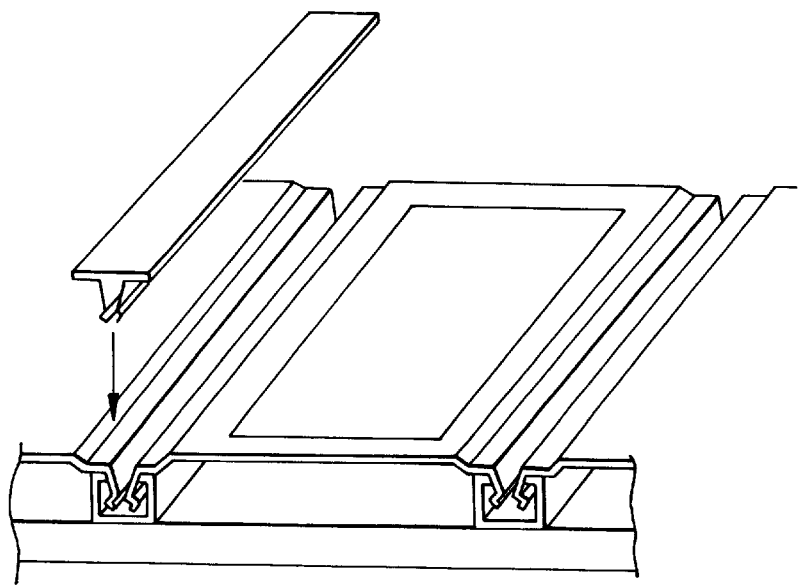

The photovoltaic device module of the present invention has a structure which is very tough to external force such as torsion, bend or impact. Hence, when installed outdoors, it has a sufficient durability to external force effected by weather such as wind, rain and hail. Thus, the photovoltaic device module of the present invention can be used in such a form that it is stuck to a roof or installed on a roof. Besides, in the instance where a steel sheet is used as the back covering material, the steel sheet may be used as a metal roof in the roof of a house as it is. In such an instance, there is no problem at all when the steel sheet is worked by bending to have structures suited for roof installation. FIGS. 11 to 13 show examples of the construction material of the present invention. FIG. 11 shows an example where it is used in lateral roofing materials; FIG. 12, in batten seam roofing materials; and FIG. 13, in flat-type roofing materials; each showing a state where the construction material is fixed to the installation surface (roof surface) by a fixing member. Roofing members (such as rafters and sheathing roof boards) and heat insulation materials may be structured integrally in order to improve roofing construction performance. The photovoltaic device module of the present invention can make up not only roofing materials but also modules set up integrally with various construction materials such as wall materials.

EXAMPLE 1

First, a moldless semiconductor device was produced. The procedure will be described with reference to FIGS. 14A and 14B.

Figure 14A:
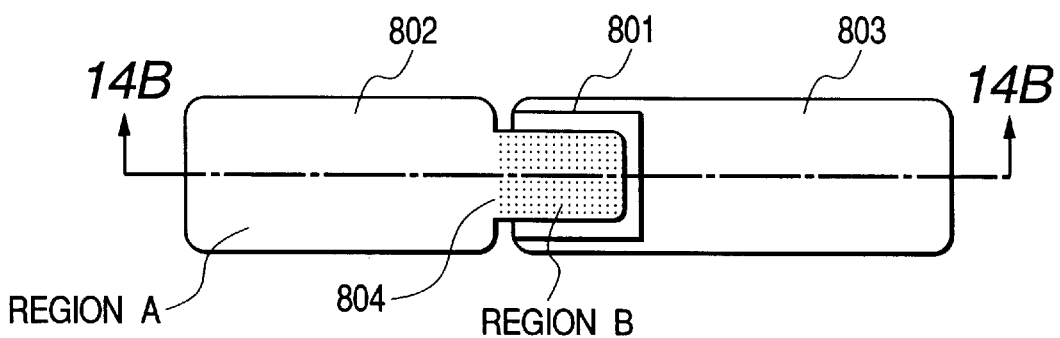
FIGS. 14A and 14B are a plan view and a cross-sectional view which illustrate schematically Example 1 of the moldless semiconductor device of the present invention.
Figure 14B:
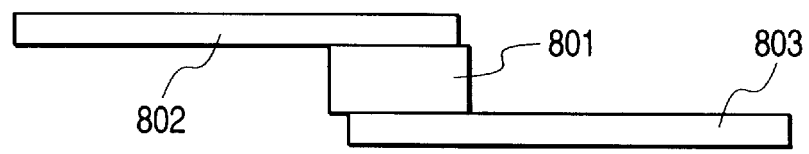

FIGS. 14A and 14B are diagrammatic views showing an appearance of a moldless semiconductor device according to Example 1 of the present invention. FIG. 14A is a plan view, and FIG. 14B a cross-sectional view along the line 14B—14B. First, a semiconductor chip 801 and outer-connecting terminals 802 and 803 were prepared. As the semiconductor chip, a mesa structure p-n rectifier diode chip (size: 1.5 mm square; thickness: 230 μm; repetitive peak-inverse voltage: 600 V) was prepared. Also, as the outer-connecting terminals 802 and 803, soft copper strips (thickness: 100 μm; oxygen-free copper C1020P; Vickers hardness: 50) were prepared. With regard to the outer-connecting terminal 802, Ni plating was applied in a thickness of 1 μm at the end portion narrowed part (region B). At this stage, the Vickers hardness at the part of the region B was measured to find that it was about 130. The outer-connecting terminals 802 and 803 were produced by punching by means of a mold press using a mold which was so made as to enable the punching into the shape as shown in FIG. 14A.

Next, these members were disposed in an assembly jig in the order as shown in FIG. 14B and were put into a nitrogen reflow furnace in the state that solder pellets (not shown) were placed between the diode chip 801 and the outer-connecting terminals 802 and 803, where the solder was melted to connect the members 801, 802 and 803 electrically.

The above procedure was repeated to produce fifty moldless diodes A which were Ni-plated at their end portions. After the production, their total thickness was 480 μm on the average.

EXAMPLE 2

In Example 2, fifty moldless diodes B, C and D each were produced. The moldless diodes B were produced in entirely the same manner as in Example 1 except that the Ni plating at the end portion of the outer-connecting terminal 802 was applied in a thickness of 0.5 μm (Vickers hardness: 75).

The moldless diodes C were produced in entirely the same manner as in Example 1 except that the Ni sputtering vapor deposition at the end portion of the outer-connecting terminal 802 was applied in a thickness of 1,000 angstroms (Vickers hardness: 55).

The moldless diodes D were produced in entirely the same manner as in Example 1 except that tin-containing copper strips (thickness 100 μm; Vickers hardness: 130) were used as the outer-connecting terminals 802 and 803, and silver plating was applied at the end portion of the outer-connecting terminal 802 in a thickness of 1 μm. The part plated with silver had a Vickers hardness of about 160.

EXAMPLE 3

Figure 15A:
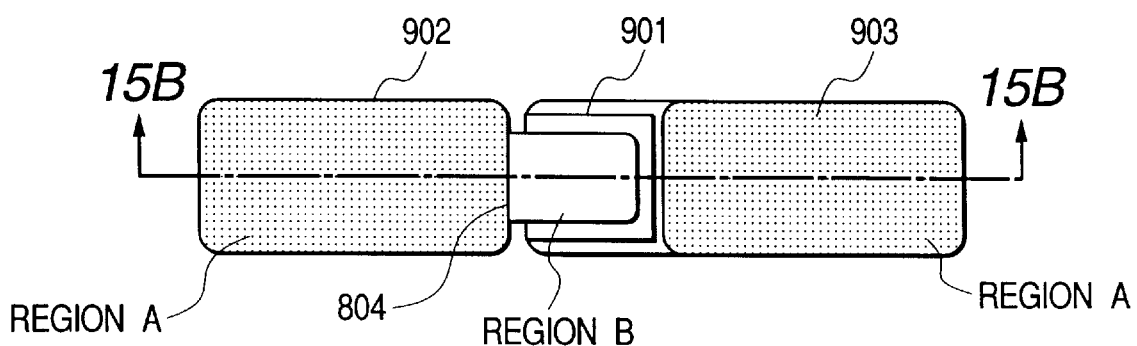
FIGS. 15A and 15B are a plan view and a cross-sectional view which illustrate schematically Example 3 of the moldless semiconductor device of the present invention.
Figure 15B:
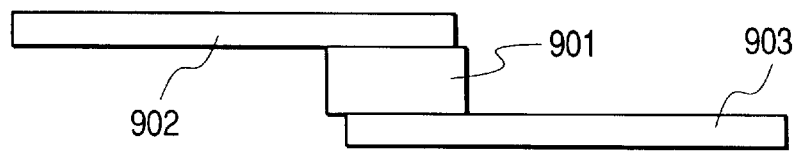

FIGS. 15A and 15B are diagrammatic views showing an appearance of a moldless semiconductor device according to Example 3 of the present invention. FIG. 15A is a plan view, and FIG. 15B a cross-sectional view along the line 15B—15B.

In Example 3, fifty moldless diodes E were produced. These were produced in entirely the same manner as in Example 1 except that solder plating was applied at the regions A of both outer-connecting terminals 902 and 903. The copper strips plated with solder had a thickness of 1 μm and a Vickers hardness of about 100 at that part.

EXAMPLE 4

Figure 16A:
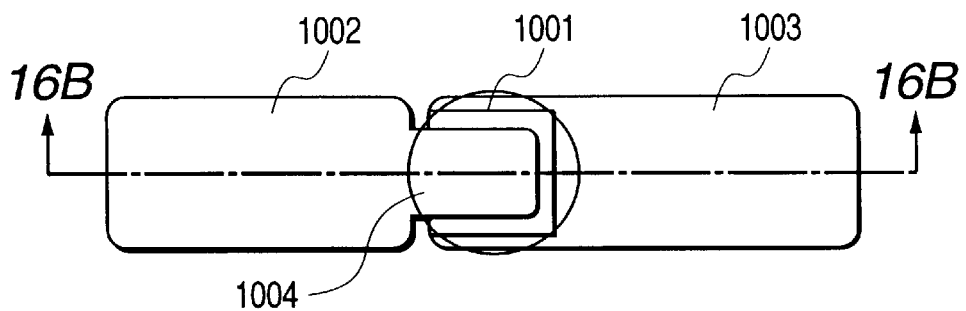
FIGS. 16A and 16B are a plan view and a cross-sectional view which illustrate schematically Example 4 of the moldless semiconductor device of the present invention.
Figure 16B:
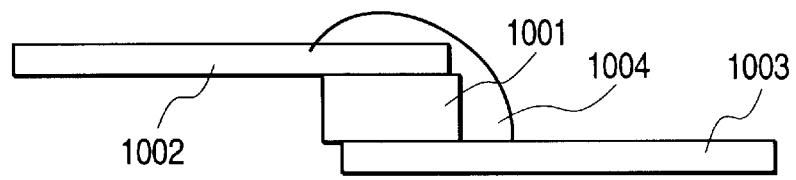

FIGS. 16A and 16B are diagrammatic views showing an appearance of a moldless semiconductor device according to Example 4 of the present invention. FIG. 16A is a plan view, and FIG. 16B a cross-sectional view along the line 16B—16B. First, a semiconductor chip 1001 and outer-connecting terminals 1002 and 1003 were prepared. As the semiconductor chip, a mesa structure p-n rectifier diode chip (size: 1.5 mm square; thickness: 230 μm; repetitive peak-inverse voltage: 600 V) was prepared. Also, as the outer-connecting terminals 1002 and 1003, soft copper strips (thickness: 100 μm; oxygen-free copper C1020P; Vickers hardness: 50) were prepared. The outer-connecting terminals 1002 and 1003 were produced by punching by means of a mold press using a mold which was so made as to enable the punching into the shape as shown in FIG. 16A.

Next, these members were disposed in an assembly jig in the order as shown in FIG. 16B and were put into a nitrogen reflow furnace in the state that solder pellets (not shown) were placed between the diode chip 1001 and the outer-connecting terminals 1002 and 1003, where the solder was melted to connect the members 1001, 1002 and 1003 electrically.

Next, from just above the narrowed part of the outer-connecting terminal 1002, about 0.2 g of silicone resin was so applied by dotting as to substantially cover the diode chip 1001; thus a silicone resin (an elastic material) 1004 was formed on the chip. The silicone resin used was SE9186L (JIS-A hardness: 27), available from Toray Dow Corning, Inc. After the silicone resin was applied by dotting, the silicone resin was left for about 1 week at room temperature in air to allow it to cure sufficiently.

The above procedure was repeated to produce fifty moldless diodes F at the end portions of which the silicone resin covers were formed.

EXAMPLE 5

In Example 5, fifty moldless diodes G, H and I each were produced. The moldless diodes G were produced in entirely the same manner as in Example 4 except that the silicone resin 1004 was formed using a silicone resin SH6103 (available from Toray Dow Corning, Inc.; JIS-A hardness: 40).

The moldless diodes H were produced in entirely the same manner as in Example 4 except that the silicone resin 1004 was formed using a silicone resin JCR6120L (available from Toray Dow Corning, Inc.; JIS-A hardness: 45).

The moldless diodes I were produced in entirely the same manner as in Example 4 except that the silicone resin 1004 was formed using a silicone resin SE9590 (available from Toray Dow Corning, Inc.; JIS-A hardness: 55).

EXAMPLE 6

Figure 17A:
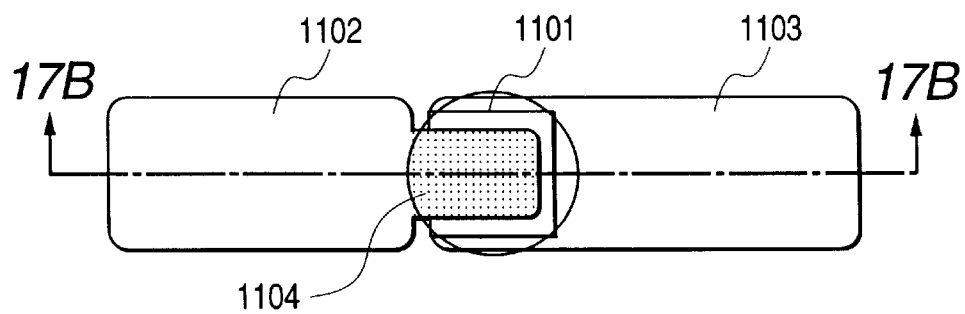
FIGS. 17A and 17B are a plan view and a cross-sectional view which illustrate schematically Example 6 of the moldless semiconductor device of the present invention.
Figure 17B:
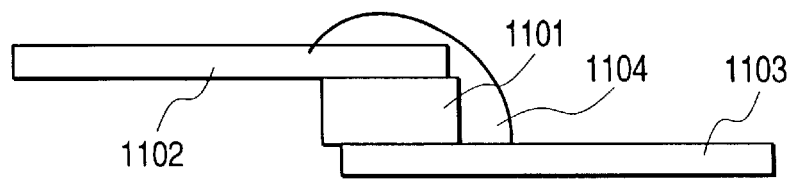

FIGS. 17A and 17B are diagrammatic views showing an appearance of a moldless semiconductor device according to Example 6 of the present Invention. FIG. 17A is a plan view, and FIG. 17B a cross-sectional view along the line 17B—17B.

In Example 6, fifty moldless diodes J on which the silicone resin was applied were produced in entirely the same manner as in Example 4 except that the moldless diode A shown in FIGS. 14A and 14B were used.

Comparative Example 1

As Comparative Example 1, fifty moldless diodes K were produced in entirely the same manner as in Example 1 except that the Ni plating was not applied.

Comparative Example 2

As Comparative Example 2, fifty moldless diodes L were produced in entirely the same manner as in Comparative Example 1 except that two outer-connecting terminals were made using hard copper strips (thickness: 100 μm; tough pitch copper; Vickers hardness: 100).

Comparative Test 1

As for the moldless diodes A to L thus produced, the following comparative test was conducted. The test (1) was for inspecting durability to torsion or bending, and test (2) was for inspecting durability to impact.

(1) Torsional test:

The two outer-connecting terminals of each moldless diode were held with a jig at the points 2 mm distant from their ends, and the outer-connecting terminals were so bent as to be twisted by 45 degrees. Next, they were twisted by 45 degrees in the opposite direction. This cycle was regarded as one. Such a test was made three times.

(2) Gravity-drop test:

Each moldless diode was placed horizontally on a wood board 4 cm thick and 15 cm square in size, which was then dropped by gravity at a height of 75 cm. This test was conducted three times.

In these tests, initial values of characteristics (VF, IR) were beforehand measured before the tests, and those showing characteristics of initial values ×2 or more after the tests were judged to be N.G. (no good). Also, in appearance, those in which the outer-connecting terminals had ruptured or the diode chip had broken were judged to be N.G. Both tests (1) and (2) were made on twenty-five moldless diodes each.

The test results are shown in Table 1.

As is clear from comparison between the moldless diodes A, B, C, D, E, F, K and L, those in which the hardness difference is provided in the outer-connecting terminal are improved in the durability to torsion. As is also clear from comparison between A, B, C and D, those made to have a hardness difference by 30 or more in Vickers hardness have a higher durability to torsion. As is still also clear from comparison between A and E, those having a higher hardness at the semiconductor chip adjacent region than at the other region have a higher durability to torsion.

Then, as is clear from comparison between F, G, H, I and K, those provided with the elastic material on the semiconductor chip, though having no difference in the durability to torsion, have an absolutely higher durability to impact. As is also clear from comparison between F, G, H and I, those having a JIS-A hardness of 50 or less have a still higher durability to impact.

Then, as is clear from the results of the moldless diode J, those in which the hardness difference is provided in the outer-connecting terminal and also the elastic material is placed on the semiconductor chip exhibit a very good effect.

EXAMPLE 7

First, an amorphous silicon solar cell module was manufactured. The procedure of its manufacture will be described with reference to FIGS. 18A to 18C.

Figure 18A:
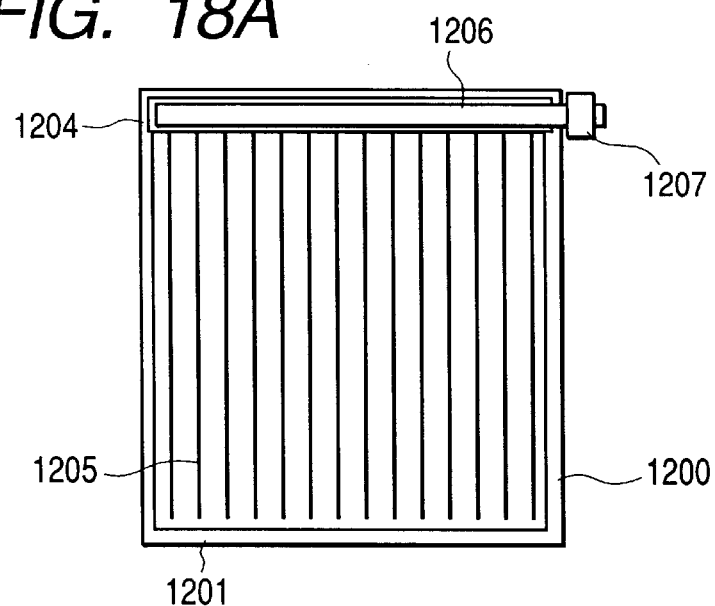
FIGS. 18A, 18B and 18C are plan views and a cross-sectional view which illustrate an example of a photovoltaic device module employing the moldless semiconductor device of the present invention.
Figure 18B:
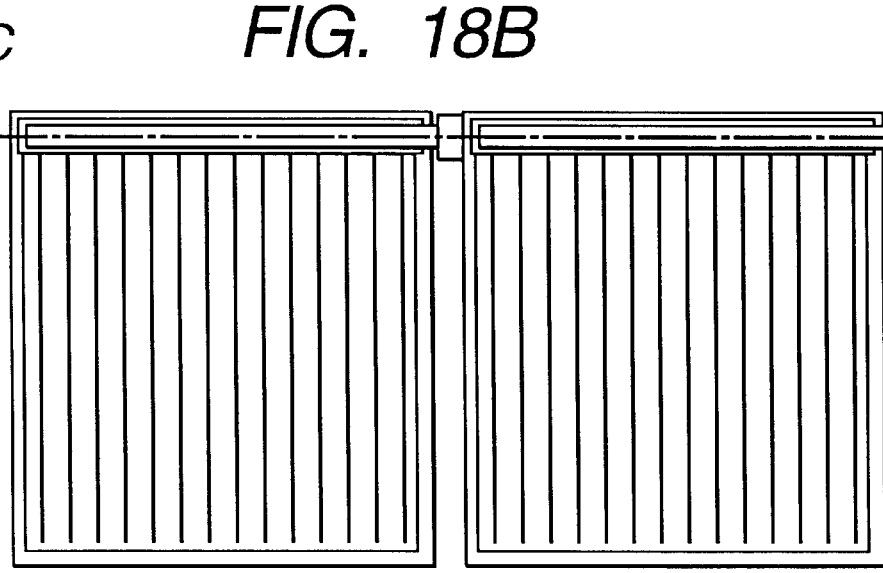
Figure 18C:
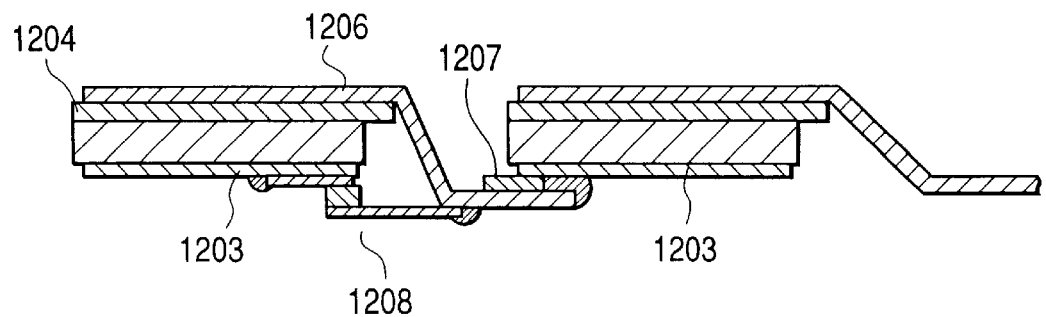

FIGS. 18A to 18C are diagrammatic views showing an appearance of a photovoltaic device module according to Example 7 of the present invention. FIG. 18A illustrates a photovoltaic device as viewed on the light-receiving side. FIG. 18B illustrates an instance where photovoltaic devices are interconnected in series to form a photovoltaic device module, as viewed on the light-receiving side. FIG. 18C is a cross-sectional view along the line 18C—18C.

In FIG. 18A, reference numeral 1200 denotes a photovoltaic device of 300 mm×280 mm comprising a substrate and three components, a lower electrode layer, amorphous silicon having photovoltaic function and an upper electrode layer. The materials described in the embodiments set forth previously may appropriately be used. In the present example, the substrate supporting the whole photovoltaic device was a stainless steel sheet 150 μm thick, and the lower electrode layer was formed directly on the substrate by depositing Al and ZnO successively in a thickness of thousands of angstroms each by sputtering. The amorphous silicon was formed by depositing n-type, i-type, p-type, n-type, i-type, p-type, n-type, i-type and p-type layers, in this order, from the substrate by plasma enhanced CVD. The upper electrode layer was a transparent electrode film, which was formed by vapor-depositing In in an atmosphere of $O_2$ by resistance heating to form an indium oxide thin film of about 700 angstroms.

Next, on the photovoltaic device thus prepared, in order for its effective light-receiving region not to be adversely affected by a short circuit between the substrate and the transparent electrode film which may occur when the photovoltaic device is cut along its outer edges of perimeter, an etching paste containing $FeCl_3$, $AlCl_3$ or the like was coated on its transparent electrode film by screen printing, followed by heating and then cleaning, thus the transparent electrode film of the photovoltaic device was removed partly in lines to form etching lines 1201.

Thereafter, along one side (line) of edges on the back of the photovoltaic device 1200, a soft copper foil 1203 7.5 mm wide, 285 mm long and 100 μm thick serving as a back-side electric power withdrawing member was connected to the conductive substrate by laser welding.

Thereafter, along one side (line) of edges of the photovoltaic device 1200 on its light-receiving side opposite to the back-side conductive foil 1203, a polyimide substrate insulating adhesive tape 1204 was stuck which was 7.5 mm wide, 280 mm long and 200 μm thick. Here, the insulating adhesive tape 1204 was stuck in such a way that it protruded a little so that it covered an edge portion along the right side (line) of the photovoltaic device 1200.

Thereafter, carbon-coated wires comprising a copper wire of 100 μm diameter previously coated with carbon paste were formed on the photovoltaic device 1200 and the insulating adhesive tape 1204 at intervals of 5.6 mm to provide a collector electrode 1205.

On the insulating adhesive tape 1204, a bus bar electrode 1206 was further formed as an additional collector electrode of the collector electrode 1205. As the bus bar electrode 1206, a silver-coated copper foil 5 mm wide, 285 mm long and 100 μm thick was used, which was placed on the insulating tape and thereafter fixed by heating and pressing together with the wire electrode under conditions of 200° C., 3 kg/cm² and 180 seconds. Here, as shown in FIG. 18A, one side of the silver-coated copper foil 1206 was so made as to extend outward from the photovoltaic device 1200.

Next, a transparent PET tape 1207 of 7 mm square and 130 μm thick was applied onto the silver-coated copper foil 1206 in part at its part protruding from the photovoltaic device.

Photovoltaic devices thus produced were electrically interconnected in series as shown in FIGS. 18B and 18C.

As shown in these drawings, the silver-coated copper foil 1206 with the PET tape 1207 extending outward from the photovoltaic device was made to crawl to the back side of the adjacent photovoltaic device and was connected to the backside soft copper foil 1203 by soldering. Here, it was so connected that the PET tape 1207 came into contact with an edge portion of the adjacent photovoltaic device. Incidentally, in the drawings, an instance of series connection of two devices is shown. In practice, five photovoltaic devices were connected in series.

Next, the moldless diode A 1208, produced in Example 1 was disposed on the back side of the photovoltaic device as shown in FIG. 18C, and the outer-connecting terminal connected to the p-side of the diode and the outer-connecting terminal connected to the n-side of the diode were connected to the backside soft copper foil 1203 and the bus bar electrode, respectively, by soldering to ensure electrical conduction. The diode 1208 was connected one by one to each photovoltaic device.

Figure 19A:
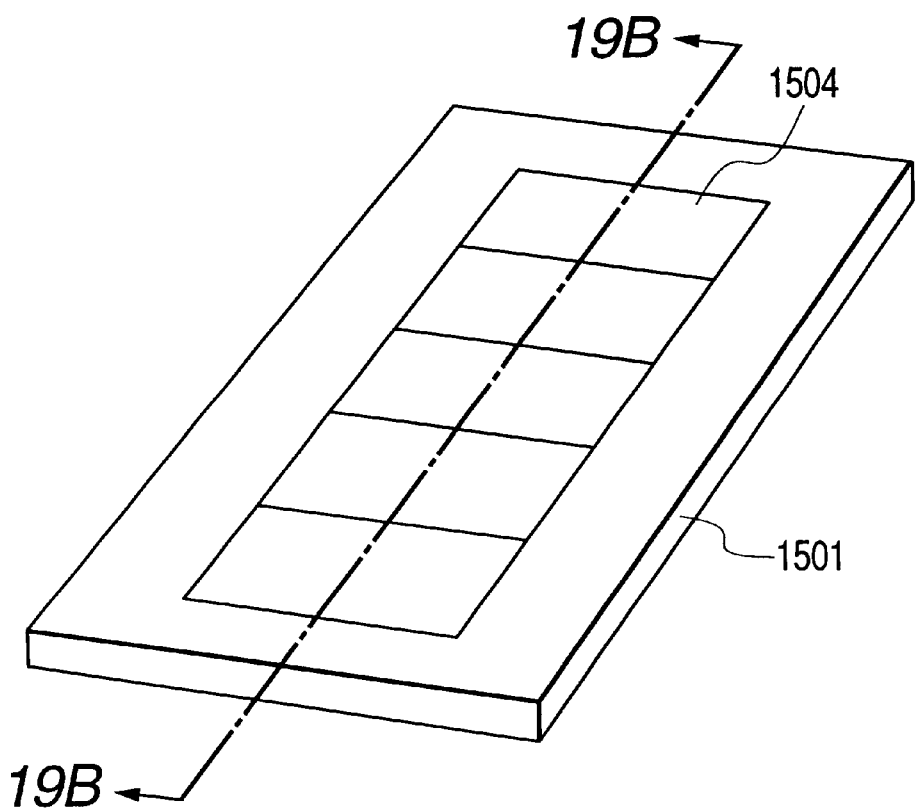
FIGS. 19A and 19B are a perspective view and a cross-sectional view which illustrate schematically a solar cell module comprising a photovoltaic device module employing the moldless semiconductor device of the present invention.
Figure 19B:
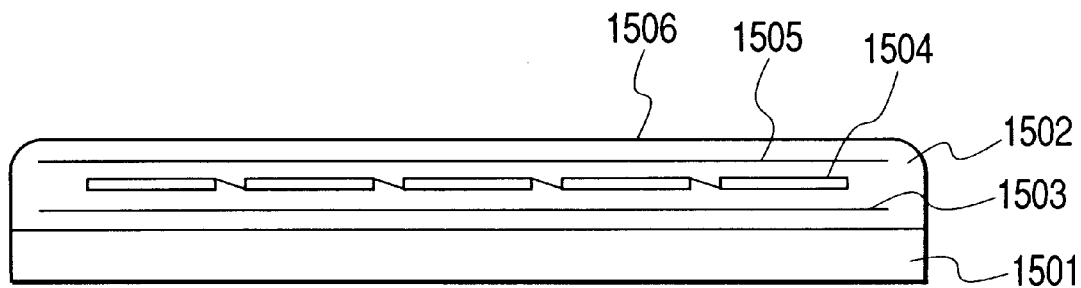

Next, these five-series photovoltaic device modules were covered with resin (by lamination) as shown in FIGS. 19A and 19B. FIG. 19A is a perspective view, and FIG. 19B a cross-sectional view along the line 19B—19B.

The five-series photovoltaic device modules, EVA (ethylene-vinyl acetate copolymer) sheets (thickness: 460 μm), an unstretched ETFE (polyethylene tetrafluoroethylene) film (thickness: 50 μm) one-side treated by plasma discharge, a polyethylene terephthalate (PET) film (thickness: 50 μm) and a galvanized steel sheet (thickness: 0.4 mm) were superposed in the order of ETFE 1506, EVA 1502, five-series photovoltaic device modules 1504, EVA 1502, PET 1503, EVA1502 and steel sheet 1501 from the top to make up a solar cell module laminate. Next, on the outer side of the ETFE, a stainless steel mesh (40×40 mesh; wire diameter: 0.15 mm) was provided via a release Teflon film (thickness: 50 μm), and the laminate was heated and press-bonded by means of a vacuum laminator at 150° C. for 30 minutes while deaerating the laminate under pressure. Thus, a solar cell module as shown in FIGS. 19A and 19B was obtained. On the surface of the surface covering material, unevenness of 30 μm at maximum in undulation difference was formed because of the mesh.

An output terminal was beforehand put around to the back of the photovoltaic device module so that the output power can be withdrawn from a terminal lead-out opening made previously in the galvanized steel sheet 1501. The steel sheet 1501 as a reinforcing sheet of this module was further worked by bending at its part extending outside the device module 1504 by means of a roller former to provide a "roofing material integral type solar cell module" whose reinforcing sheet had the function of a roofing material as it was.

Incidentally, the EVA sheets used here are widely used as sealing materials for solar cells and are obtained by mixing 1.5 parts by weight of an organic peroxide as a cross-linking agent, 0.3 part by weight of an ultraviolet light absorber, 0.1 part by weight of a photostabilizer, 0.2 part by weight of a thermal oxidation inhibitor and 0.25 part by weight of a silane coupling agent in 100 parts by weight of EVA resin (vinyl acetate content: 33%).

Thus, roofing material integral type solar cell module A' was produced.

EXAMPLE 8

In Example 8, roofing material integral type solar cell module B' was produced. In Example 8, the procedure of Example 7 was repeated except that the moldless diode A was replaced with the moldless diode F described in Example 4.

EXAMPLE 9

In Example 9, roofing material integral type solar cell module C' was produced. In Example 9, the procedure of Example 7 was repeated except that the moldless diode A was replaced with the moldless diode J described in Example 6.

EXAMPLE 10

Figure 20A:
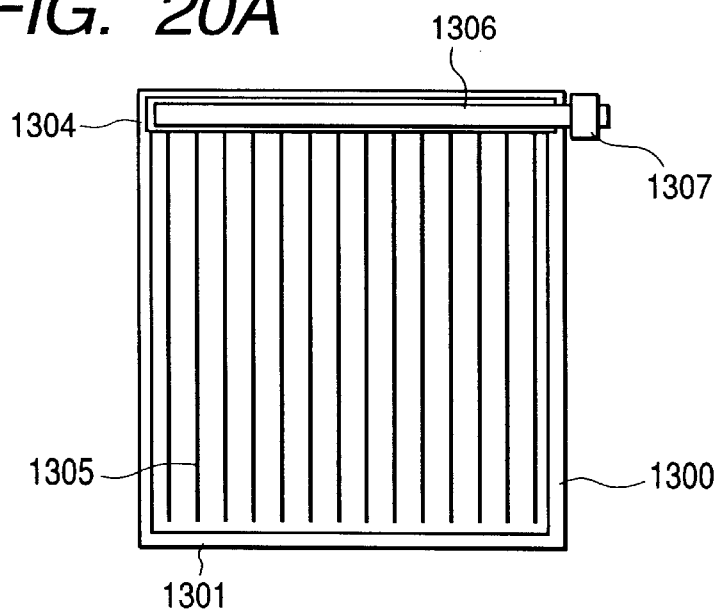
FIGS. 20A, 20B and 20C are plan views and a cross-sectional view which illustrate another example of a photovoltaic device module employing the moldless semiconductor device of the present invention.
Figure 20B:
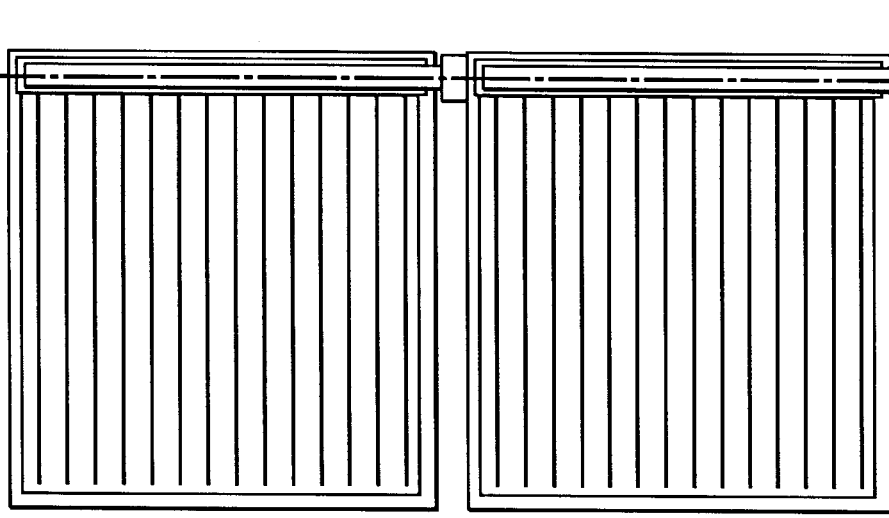
Figure 20C:
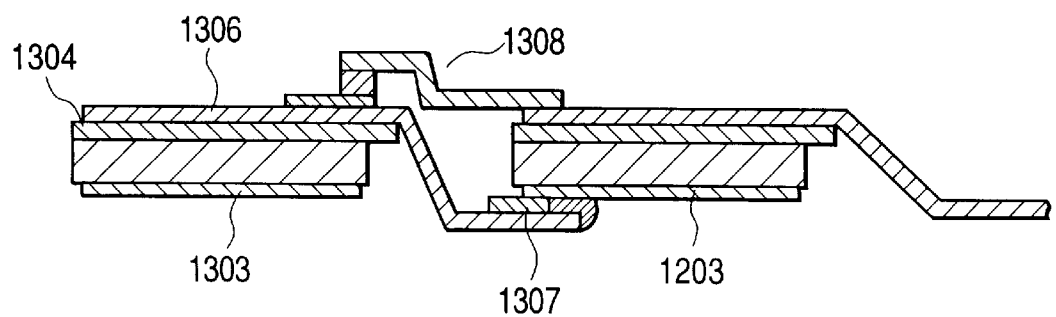

In Example 10, roofing material integral type solar cell module D' was produced. FIGS. 20A to 20C are diagrammatic views showing an appearance of a photovoltaic device module according to Example 10 of the present invention. FIG. 20A illustrates a photovoltaic device as viewed on the light-receiving side. FIG. 20B illustrates an instance where photovoltaic devices are interconnected in series to form a photovoltaic device module, as viewed on the light-receiving side. FIG. 20C is a cross-sectional view along the line 20C—20C.

In the present example, the procedure of Example 7 was repeated except that the moldless diode A was provided not on the non-light-receiving side of the photovoltaic device, but on the light-receiving side as shown in FIGS. 20A to 20C.

In FIGS. 20A to 20C, a diode 1308 is placed on a bus bar 1306 on the light-receiving side of the photovoltaic device, and the p-side of the diode and the n-side of the diode are connected electrically to the bus bar 1306 and the bus bar of the adjacent photovoltaic device, respectively.

Comparative Example 3

In Comparative Example 3, roofing material integral type solar cell module E' was produced. In Comparative Example 3, the procedure of Example 7 was repeated except that the moldless diode A was replaced with the moldless diode K described in Comparative Example 1.

Comparative Test 2

On the roofing material integral type solar cell modules A' to E' produced as described above, which were installed on the same stands as those used in actual roofing, comparative tests were made as if they would be affected by wind, rain and hail in actual outdoors. Test (1) is a test made on the assumption of how the photovoltaic device is electrified when it is shadowed. Test (2) is a test made on the assumption of how the module becomes bent by the wind, and Test (3) on the assumption that it hailed. As Test (4), after the diode was soldered on the photovoltaic device, the diode and the outer-connecting terminals were examined on whether or not they were damaged by any sudden force applied during the soldering.

(1) Electrification test:

In a 75° C. furnace, a short-circuit current of photovoltaic devices, Isc=3.2 (A), was flowed through the diode for 1,000 hours. With regard to the electrification test, the characteristics of the photovoltaic device and the appearance of the photovoltaic device module itself were examined before and after the test.

(2) Bending test:

A bending test according to IEEE Standard, Draft 9, was made by 10,000 cycles.

(3) Hail impact test:

A hail impact test according to IEEE Standard, Draft 9, was made. Ice balls were caused to strike intentionally the five connected diodes.

In these tests, the conversion efficiency of each photovoltaic device was measured with a solar simulator before and after the test to accomplish evaluation.

The test results are shown in Table 2.

With regard to the electrification test, no decrease in conversion efficiency was seen in any of the modules. In appearance, too, the laminate materials such as the filler in the vicinity of the diode did not appear to be separated. From these facts, the heat dissipation is considered to have been improved because all the moldless diodes are provided in close contact with the electrodes of the photovoltaic device.

With regard to the bending test, no decrease in conversion efficiency was seen in modules A', C' and D'. In the module B', however, a decrease in conversion efficiency by 0.8% was seen, and in the module E' by 32%. As can be seen from this fact, even in the form of the module, the product has a low bend resistance when the hardness difference is not provided between the chip adjacent region and the other region.

With regard to the impact test, no decreases in conversion efficiency was seen in the modules B' and C'. In the module A', however, a decrease in conversion efficiency by 1.2% was seen, in the module D' by 2.0%, and in the module E' by 7.5%. From these results, the conversion efficiency of the module is considered to have decreased, because, when provided with no elastic material, it has so poor an impact resistance that the diodes can break upon impact with ice balls. Also, as can be seen from comparison between the modules A' and D', since the module D' shows a decrease at a greater rate, it is more advantageous for the diodes to be connected on the non-light-receiving side.

Then, with regard to the appearance examination, only the module E' was seen to have cracked slightly at the end portion narrowed part of outer-connecting terminals of its two diodes. No change was especially seen with regard to other modules. From the foregoing results, the photovoltaic device to which the moldless semiconductor device of the present invention is connected is considered to be more improved in reliability than ever.

TABLE 1

|  | | Number of N.G. | |
| --- | --- | --- | --- |
|  | Example | Torsion test | Gravity-drop test |
| Moldless diode A: | 1 | 0 | 25 |
| Moldless diode B: | 2 | 13 | 25 |
| Moldless diode C: | 2 | 15 | 25 |
| Moldless diode D: | 2 | 4 | 25 |
| Moldless diode E: | 3 | 2 | 25 |
| Moldless diode F: | 4 | 19 | 0 |
| Moldless diode G: | 5 | 20 | 0 |
| Moldless diode H: | 5 | 22 | 0 |
| Moldless diode I: | 5 | 22 | 2 |
| Moldless diode J: | 6 | 0 | 0 |
| Moldless diode K: | 1* | 20 | 25 |
| Moldless diode L: | 2* | 25 | 25 |

*Comparative Example

TABLE 2

|  | Module A' | Module B' | Module C' | Module D' | Module E' |
| --- | --- | --- | --- | --- | --- |
| (1) Electrification test | | | | | |
| Before test: | 9.21% | 9.22% | 9.18% | 9.21% | 9.25% |
| After test: | 9.23% | 9.23% | 9.20% | 9.21% | 9.23% |
| (2) Bending test | | | | | |
| Before test: | 9.12% | 9.21% | 9.23% | 9.21% | 9.15% |
| After test: | 9.12% | 9.14% | 9.22% | 9.23% | 8.86% |

TABLE 2-continued

|  | Module A' | Module B' | Module C' | Module D' | Module E' |
|---|---|---|---|---|---|
| (3) Hail impact test |  |  |  |  |  |
| Before test: | 9.13% | 9.20% | 9.21% | 9.17% | 9.10% |
| After test: | 9.02% | 9.23% | 9.22% | 9.00% | 8.42% |
| (4) Appearance examination | No change | No change | No change | No change | Terminals of two diodes cracked. |

As described above, the moldless semiconductor device of the present invention has achieved a very thin structure and has made it possible to be incorporated in photovoltaic devices with ease and to use resin in a small quantity when sealed with the resin. The present invention can also provide semiconductor devices which are tough to torsion, bend and impact even though they are moldless and can solve the problems the prior art has had. As the photovoltaic device module to which the present semiconductor device is connected, it becomes possible to provide modules which are tough to torsion, bend and impact. Also, since the semiconductor device may be connected on the electrode members, it is possible to solve the problem caused by heat in the laminate materials.

What is claimed is:

1. A moldless semiconductor device comprising a semiconductor chip held between two outer-connecting terminals and connected electrically to the terminals,
wherein at least one terminal has, at its region contiguous to the semiconductor chip or at its region contiguous to the semiconductor chip and a region vicinal thereto, a hardness different from the hardness of all other regions of said at least one terminal.

2. The moldless semiconductor device according to claim 1, wherein the hardness at the region contiguous to the semiconductor chip or at the region contiguous to the semiconductor chip and a region vicinal thereto is different from the hardness of all other regions of said one terminal by 30 or more in Vickers hardness.

3. The moldless semiconductor device according to claim 1, wherein the hardness at the region contiguous to the semiconductor chip or at the region contiguous to the semiconductor chip and a region vicinal thereto has a hardness higher than the hardness of all other regions of said one terminal.

4. The moldless semiconductor device according to claim 1, wherein all other regions of said one terminal has a hardness of 120 or less in Vickers hardness.

5. The moldless semiconductor device according to claim 1, wherein a part of the semiconductor chip is covered with an elastic material.

6. The moldless semiconductor device according to claim 5, wherein the elastic material comprises an organic high polymer resin having a hardness of 50 or less in JIS-A hardness.

7. The moldless semiconductor device according to claim 6, wherein the organic high polymer resin comprises a silicone resin.

8. The moldless semiconductor device according to claim 6, wherein the organic high polymer resin comprises a moisture-curing resin.

9. A photovoltaic device module comprising a plurality of photovoltaic devices each having an electrode member, which are interconnected electrically through a connecting member,
wherein the moldless semiconductor device according to any one of claims 1 to 8 is connected in close contact with any one of the electrode member and the connecting member.

10. The photovoltaic device module according to claim 9, wherein the moldless semiconductor device is provided on the non-light-receiving side of the photovoltaic devices.

11. The photovoltaic device module according to claim 9, wherein the photovoltaic device module is flexible.

12. The photovoltaic device module according to claim 9, wherein at least a part of the photovoltaic device module is bent.

13. The photovoltaic device module according to claim 9, wherein the plurality of photovoltaic devices are connected in series, a plurality of moldless semiconductor devices is provided and connected to individual photovoltaic devices in parallel, and the semiconductor chip of each moldless semiconductor device comprises a diode.

14. A solar cell module comprising a surface covering material, a resin, the photovoltaic device module according to claim 9, the resin, and a back covering material provided in this order from a light-receiving side of the solar cell module.

15. A construction material comprising a protective film, a resin, the photovoltaic device module according to claim 9, the resin, and a reinforcing plate provided in this order from a light receiving side of the construction material, wherein the reinforcing plate is bent.

16. The moldless semiconductor device according to claim 1, wherein at least one terminal is provided with, at its region contiguous to the semiconductor chip or at its region contiguous to the semiconductor chip and a region vicinal thereto, a material different from a material of all other regions of said at least one terminal.

17. The moldless semicondutor device according to claim 16, wherein the material different from a material of the terminal is provided on one side or both sides of the terminal.

18. The moldless semiconductor device according to claim 16, wherein the material different from a material of the terminal is formed by metal plating, metal vapor deposition or rigid-film coating.

19. The moldless semiconductor device according to claim 1, wherein at least one of the two terminals is modified by ion implantation at its region contiguous to the semiconductor chip or at its region contiguous to the semiconductor chip and a region vicinal thereto.

20. A moldless semiconductor device comprising a semiconductor chip held between two outer-connecting terminals and connected electrically to the terminals,
wherein at least a part of the semiconductor chip is covered with an elastic material comprising an organic high polymer resin having a harness of 50 or less in JIS-A harness, the elastic material does not completely cover the moldless semiconductor device, and an outer-connecting portion of each of the two outer-connecting terminals is bare.

21. The moldless semiconductor device according to claim 20, wherein the organic high polymer resin comprises a silicone resin.

22. The moldless semiconductor device according to claim 20, wherein the organic high polymer resin comprises a moisture-curing resin.

* * * * *

UNITED STATES PATENT AND TRADEMARK OFFICE
CERTIFICATE OF CORRECTION

PATENT NO. : 6,316,832 B1
DATED : November 13, 2001
INVENTOR(S) : Tsuzuki et al.

It is certified that error appears in the above-identified patent and that said Letters Patent is hereby corrected as shown below:

<u>Title page,</u>
Item [56], References Cited, FOREIGN PATENT DOCUMENTS, "0535614 4/1993 (EP)" should be deleted.
"0789392 8/1997 (EP)" should be deleted.
"57036852" should read -- 57-036852 --.
OTHER PUBLICATIONS, "57-636852" should read -- 57-036852 --.
"Patent Abstracts of Japan, vol. 6, No. 107(E-113), 6/82 for JP 57-036852." should be deleted.
"Patent Abstracts of Japan, vol. 13, No. 476 (E-837), 10-89 JP 1-187958." should be deleted.
Item [57], ABSTRACT,
Line 2, "between outer-connecting" should read -- between two outer-connecting --.

<u>Column 3,</u>
Line 39, "use" should read -- used --.

<u>Column 9,</u>
Line 27, "but not" should read -- but are not --.

<u>Column 11,</u>
Line 42, "According," should read -- Accordingly, --.

<u>Column 14,</u>
Line 58, "silicon cells" should read -- silicon solar cells --.

<u>Column 17,</u>
Line 34, "Invention." should read -- invention. --.

UNITED STATES PATENT AND TRADEMARK OFFICE
CERTIFICATE OF CORRECTION

PATENT NO. : 6,316,832 B1
DATED : November 13, 2001
INVENTOR(S) : Tsuzuki et al.

It is certified that error appears in the above-identified patent and that said Letters Patent is hereby corrected as shown below:

<u>Column 18,</u>
Line 42, "according.to" should read -- according to --.
Line 67, "angstroms." should read -- angstroms thick. --.

Signed and Sealed this

Tenth Day of December, 2002

JAMES E. ROGAN
*Director of the United States Patent and Trademark Office*